United States Patent
Chou et al.

(10) Patent No.: US 12,310,073 B2
(45) Date of Patent: May 20, 2025

(54) TRANSISTORS HAVING TWO-DIMENSIONAL SEMICONDUCTOR CHANNELS

(71) Applicants: TAIWAN SEMICONDUCTOR MANUFACTURING COMPANY, LTD., Hsinchu (TW); NATIONAL YANG MING CHIAO TUNG UNIVERSITY, Hsinchu (TW)

(72) Inventors: Chen Han Chou, Tainan (TW); Shu-Jui Chang, Hsinchu County (TW); Yen-Teng Ho, Hsinchu (TW); Chia Hsing Wu, New Taipei (TW); Kai-Yu Peng, Miaoli County (TW); Cheng Hung Shen, New Taipei (TW); Chenming Hu, Oakland, CA (US)

(73) Assignees: TAIWAN SEMICONDUCTOR MANUFACTURING COMPANY, LTD., Hsinchu (TW); NATIONAL YANG MING CHIAO TUNG UNIVERSITY, Hsinchu (TW)

( * ) Notice: Subject to any disclaimer, the term of this patent is extended or adjusted under 35 U.S.C. 154(b) by 438 days.

(21) Appl. No.: 17/702,637

(22) Filed: Mar. 23, 2022

(65) Prior Publication Data
US 2023/0008409 A1 Jan. 12, 2023

Related U.S. Application Data

(60) Provisional application No. 63/220,413, filed on Jul. 9, 2021.

(51) Int. Cl.
*H01L 29/94* (2006.01)
*H01L 29/76* (2006.01)
(Continued)

(52) U.S. Cl.
CPC ......... *H10D 62/118* (2025.01); *H10D 30/031* (2025.01); *H10D 30/6713* (2025.01);
(Continued)

(58) Field of Classification Search
CPC ......... H01L 29/0665; H01L 21/823412; H01L 21/823418; H01L 27/0886;
(Continued)

(56) References Cited

U.S. PATENT DOCUMENTS 6,921,700 B2  7/2005 Orlowski
9,209,247 B2  12/2015 Colinge et al.
(Continued)

FOREIGN PATENT DOCUMENTS

CN  110880506 A  3/2020
CN  110970425 A  4/2020
(Continued)

OTHER PUBLICATIONS

N. Loubet et al., "Stacked Nanosheet Gate-All-Around Transistor to Enable Scaling Beyond FinFET" 2003.

*Primary Examiner* — Theresa T Doan
(74) *Attorney, Agent, or Firm* — Maschoff Brennan

(57) ABSTRACT

A device comprises a plurality of 2D semiconductor nanostructures, a gate structure, a source region, and a drain region. The plurality of 2D semiconductor nanostructures extend in a first direction above a substrate and arranged in a second direction substantially perpendicular to the first direction. The gate structure surrounds each of the plurality of 2D semiconductor nanostructures. The source region and the drain region are respectively on opposite sides of the gate structure.

20 Claims, 31 Drawing Sheets

(51) Int. Cl.
*H10D 30/01* (2025.01)
*H10D 30/67* (2025.01)
*H10D 62/10* (2025.01)
*H10D 64/01* (2025.01)
*H10D 84/01* (2025.01)
*H10D 84/03* (2025.01)
*H10D 84/83* (2025.01)

(52) U.S. Cl.
CPC ..... *H10D 30/6735* (2025.01); *H10D 30/6757* (2025.01); *H10D 64/017* (2025.01); *H10D 64/018* (2025.01); *H10D 84/0128* (2025.01); *H10D 84/013* (2025.01); *H10D 84/038* (2025.01); *H10D 84/834* (2025.01)

(58) Field of Classification Search
CPC ......... H01L 29/42392; H01L 29/66545; H01L 29/66553; H01L 29/66742; H01L 29/78618; H01L 29/78696; H01L 21/8256; H01L 27/092; H01L 21/823807; H01L 29/513; H01L 29/0673; H01L 29/24; H01L 29/47; H01L 29/66969; H01L 29/778; H01L 29/7839; H01L 29/78681; H01L 27/0924; H01L 29/0684; H01L 29/42356; H01L 29/66795; H01L 29/785
USPC ........................................................ 257/288
See application file for complete search history.

(56) References Cited

U.S. PATENT DOCUMENTS

| | | |
|---|---|---|
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,502,518 B2 | 11/2016 | Liu |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,647,139 B2 | 5/2017 | Doris |
| 9,658,186 B2 | 5/2017 | Yang |
| 9,899,501 B2 | 2/2018 | Pourtois |
| 10,121,856 B2 | 11/2018 | Kim et al. |
| 10,269,975 B2 | 4/2019 | Park |
| 11,049,937 B2 | 6/2021 | Cheng et al. |
| 11,329,162 B2 | 5/2022 | Kobrinsky et al. |
| 11,404,319 B2 | 8/2022 | Lilak et al. |
| 11,462,536 B2 | 10/2022 | Bowonder et al. |
| 2017/0179299 A1* | 6/2017 | Bae ................ H01L 29/42392 |
| 2020/0411520 A1* | 12/2020 | Lajoie ................ H10B 12/033 |
| 2021/0126134 A1 | 4/2021 | Ferng |

FOREIGN PATENT DOCUMENTS

| | | |
|---|---|---|
| TW | 201841378 A | 11/2018 |
| TW | 202040820 A | 11/2020 |
| TW | 202117820 A | 5/2021 |
| TW | 202117857 A | 5/2021 |

* cited by examiner

TRANSISTORS HAVING TWO-DIMENSIONAL SEMICONDUCTOR CHANNELS

PRIORITY CLAIM AND CROSS-REFERENCE

This application claims the benefit of U.S. Provisional Application No. 63/220,413, filed on Jul. 9, 2021, which application is hereby incorporated herein by reference in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
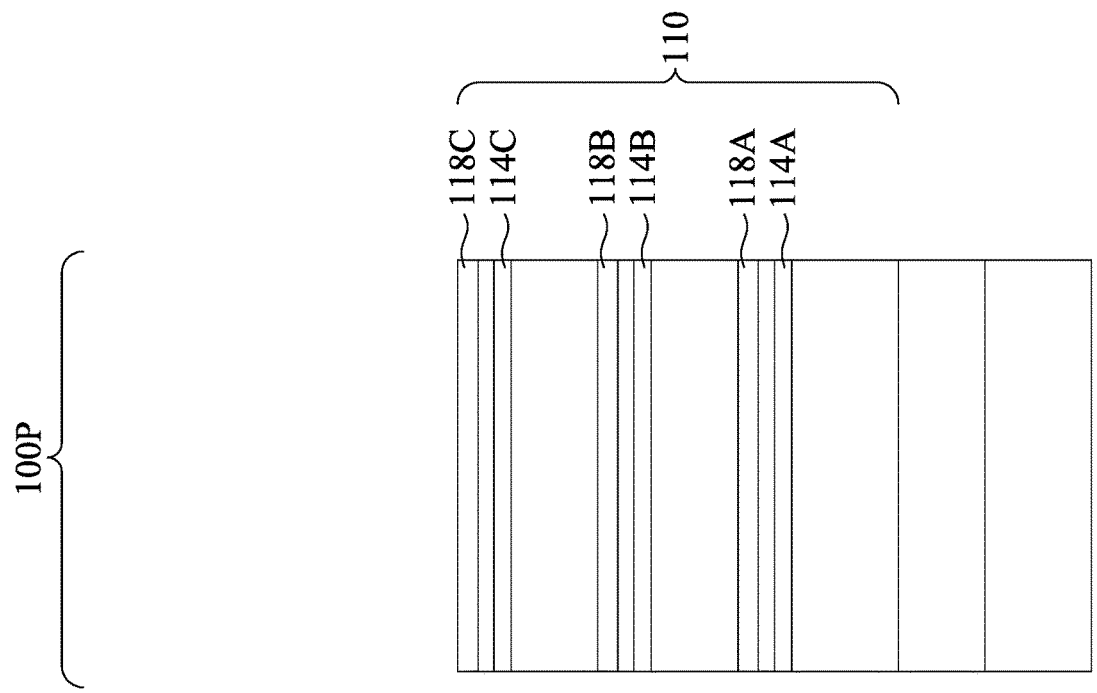
FIGS. 1A, 2B, 3B, 4B, 5B, 6B, 7B, 8B, 8C, 9B, 10B, 11B, and 12B are cross-sectional views of intermediate stages in fabricating GAA devices in accordance with some embodiments of the present disclosure, wherein each of the cross-sectional views combines a cross-sectional view obtained from first cut along a direction of current flow between source/drain regions of an n-type transistor and a cross-sectional view obtained from a second cut along a direction of current flow between source/drain regions of a p-type transistor.
Figure 1A:
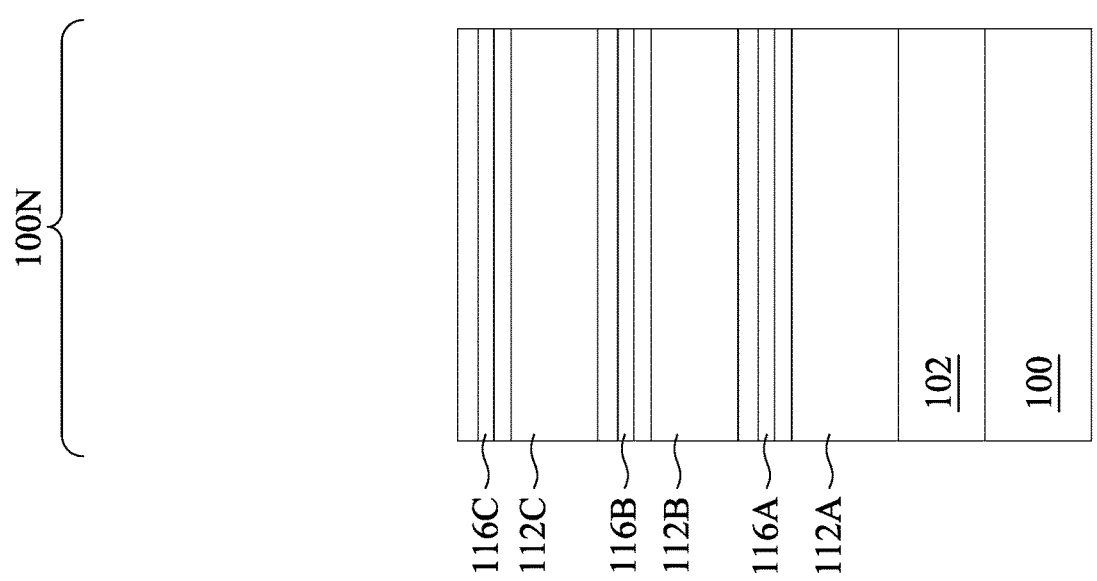

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" may generally mean within 20 percent, or within 10 percent, or within 5 percent of a given value or range. Numerical quantities given herein are approximate, meaning that the term "around," "about," "approximately," or "substantially" can be inferred if not expressly stated. One skilled in the art will realize, however, that the values or ranges recited throughout the description are merely examples, and may be reduced with the down-scaling of the integrated circuits.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is generally related to integrated circuit (IC) structures and methods of forming the same, and more particularly to fabricating gate-all-around (GAA) transistors formed using two-dimensional (2D) semiconductor material as their channels. It is also noted that the present disclosure presents embodiments in the form of multi-gate transistors. Multi-gate transistors include those transistors whose gate structures are formed on at least two-sides of a channel region. These multi-gate devices may include a p-type metal-oxide-semiconductor device and/or an n-type metal-oxide-semiconductor device. Specific examples may be presented and referred to herein as FinFET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), nanowire channel(s), and/or other suitable channel configuration. Presented herein are embodiments of devices that may have one or more channel regions (e.g., nanosheets) associated with a single, contiguous gate structure. However, one of ordinary skill would recognize that the teaching can apply to a single channel (e.g., single nanosheet) or any number of channels. One of ordinary skill may recognize other examples of semiconductor devices that may benefit from aspects of the present disclosure.

As scale of the fin width in fin field effect transistors (FinFET) decreases, channel width variations might cause mobility loss. GAA transistors, such as nanosheet transistors are being studied as an alternative to fin field effect transistors. In a GAA transistor, the gate of the transistor is made all around a plurality of channels (e.g., nanosheet channels or nanowire channels) such that each channel is surrounded or encapsulated by the gate. Such a transistor has the advantage of improving the electrostatic control of the channel by the gate, which also mitigates leakage currents. The GAA channels are generally formed of silicon (Si). However, scaling down the Si channel thickness would cause degradation of channel mobility due to increased defective channel interfaces. Therefore, the present disclosure in various embodiments provides GAA transistors formed using 2D semiconductor material as their channels. One advantageous feature of the 2D semiconductor material is the high electron mobility value, which is within a range of about 50-1000 $cm^2$/V-sec or even higher. It is understood that silicon, when formed to a low thickness (e.g., about 3 nm or lower) comparable with a thickness of a 2D semiconductor material film, can have its mobility degraded drastically. Therefore, 2D semiconductor channel thickness can be scaled down with less impact on carrier mobility than silicon, which in turn achieving satisfactory GAA channel mobility with only few nanometers in channel thickness (e.g., less than 3 nm).

FIGS. 1A-12C illustrate perspective views and cross-sectional views of intermediate stages in formation of an IC structure having multi-gate devices, in accordance with some embodiments of the present disclosure. As used herein, the term "multi-gate device" is used to describe a device (e.g., a semiconductor transistor) that has at least some gate material disposed on multiple sides of at least one channel of the device. In some examples, the multi-gate device may be referred to as a GAA device or a nanosheet device having gate material disposed on at least four sides of at least one channel of the device. The channel region may be referred to as a "nanowire," which as used herein includes channel regions of various geometries (e.g., cylindrical, bar-shaped) and various dimensions.

FIGS. 1A, 2B, 3B, 4B, 5B, 6B, 7B, 8B, 8C, 9B, 10B, 11B, and 12B are cross-sectional views of intermediate stages in fabricating GAA devices in accordance with some embodiments of the present disclosure, wherein each of the cross-sectional views combines a cross-sectional view obtained from a first cut (e.g., cut X1-X1 in FIG. 3A), which is along a direction of current flow between source/drain regions of an n-type transistor, and a cross-sectional view obtained from a second cut (e.g., cut X2-X2 in FIG. 3A), which is along a direction of current flow between source/drain regions of a p-type transistor. FIGS. 2A, 3A, 4A, 5A, 6A, 7A, 8A, 9A, 10A, 11A, and 12A are perspective views of intermediate stages in fabricating GAA devices in accordance with some embodiments of the present disclosure. FIGS. 9C and 10C are cross-sectional views of intermediate stages in fabricating GAA devices in accordance with some embodiments of the present disclosure, wherein each of the cross-sectional views combines a cross-sectional view obtained from a third cut (e.g., cut Y1-Y1 in FIG. 3A), which is along a longitudinal axis of a gate structure of the n-type transistor and in a direction perpendicular to the direction of current flow between the source/drain regions of the n-type transistor, and a cross-sectional view obtained from a fourth cut (e.g., cut Y2-Y2 in FIG. 3A), which is along a longitudinal axis of a gate structure of the p-type transistor and in a direction perpendicular to the direction of current flow between the source/drain regions of the N-type transistor.

In FIG. 1A, a substrate 100 is provided. The substrate 100 may be a semiconductor substrate, such as a bulk semiconductor, a semiconductor-on-insulator (SOI) substrate, or the like, which may be doped (e.g., with a p-type or an n-type dopant) or undoped. The substrate 100 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 100 has an n-type device region 100N and a p-type device region 100P. The n-type device region 100N can be for forming n-type devices, such as NMOS transistors, e.g., n-type GAA FETs, and the p-type device region 100P can be for forming p-type devices, such as PMOS transistors, e.g., p-type GAA FETs. The n-type device region 100N may be physically separated from the p-type device region 100P, and any number of device features (e.g., other active devices, doped regions, isolation structures, etc.) may be disposed between the n-type device region 100N and the p-type device region 100P. Although one n-type device region 100N and one p-type device region 100P are illustrated, any number of n-type device regions 100N and p-type device regions 100P may be provided.

Further in FIG. 1A, an etch stop layer 102 is formed on the substrate 100, and then a multi-layer stack 110 is formed over the substrate 100. In some embodiments, the etch stop layer 102 may be formed of silicon oxide, silicon nitride, silicon oxynitride, or other suitable dielectric materials, using techniques such as thermal oxidation or deposited by chemical vapor deposition (CVD), atomic layer deposition (ALD), or the like. The etch stop layer 102 serves to protect the substrate 100 from subsequent etching steps, such as the etching step in dummy gate formation and/or the etching step in forming source/drain regions. In some embodiments, the etch stop layer 102 has a thickness in a range from about 10 nm to about 100 nm, for example.

Once the etch stop layer 102 has been formed, a multi-layer stack 110 is then formed on the etch stop layer 102. The multi-layer stack 110 includes alternating layers of sacrificial semiconductor layers 112A-C (collectively referred to as sacrificial semiconductor layers 112), first dielectric layers 114A-C (collectively referred to as first dielectric layers 114), 2D semiconductor layers 116A-116C (collectively referred to as 2D semiconductor layers 116), and second dielectric layers 118A-118C (collectively referred to as second dielectric layers 118). For purposes of illustration and as discussed in greater detail below, the sacrificial semiconductor layers 112 will be removed and the 2D semiconductor layers 116 will be patterned to form channel regions of GAA FETs in both the n-type device region 100N and p-type device region 100P.

The multi-layer stack 110 is illustrated as including three layers of each of the sacrificial semiconductor layers 112, the first dielectric layers 114, the 2D semiconductor layers 116, and the second dielectric layers 118 for illustrative purposes. In some embodiments, the multi-layer stack 110 may include any number of the sacrificial semiconductor layers 112, the first dielectric layers 114, the 2D semiconductor layers 116, and the second dielectric layers 118. Each of the sacrificial semiconductor layers 112 of the multi-layer stack 110 is an un-doped polysilicon layer. Each of the sacrificial semiconductor layers comprises any suitable thickness. In the present embodiment, each of the sacrificial semiconductor layers 112 comprises a thickness in the range of about 16 nm to about 20 nm. Each of the sacrificial semiconductor layers 112 may be deposited by, for example, physical vapor deposition (PVD), CVD, sputter deposition, or other techniques, using silane ($SiH_4$), disilane ($Si_2H_6$), trisilane ($Si_3H_8$) or dichlorosilane ($SiH_2Cl_2$) as silicon source gas. In some embodiments, the sacrificial semiconductor layers 112 may include polysilicon with carbon-hydrogen bonds (e.g., $CH_3$) resulting from the precursor gases (e.g., dichlorosilane that contains carbon and hydrogen). The carbon-hydrogen bonds may reduce the etch resistance of the sacrificial semiconductor layers 112 and hence increase an etch rate of the sacrificial semiconductor layers 112 in a following etching step of removing the sacrificial semiconductor layers 112.

Following deposition of each of the sacrificial semiconductor layers 112, a first dielectric layer 114 is then deposited on each of the sacrificial semiconductor layers 112. In some embodiments, the first dielectric layer 114 may be an oxide, such as silicon oxide ($SiO_2$), high-k metal oxide (e.g., $Al_2O_3$), a nitride (e.g., SiN), silicon oxynitride (SiON) the like, or a combination thereof, and may be formed by furnace oxidation, CVD, ALD, high-density plasma CVD (HDP-CVD), flowable CVD (FCVD), the like, or a combination thereof. Other dielectric materials formed by any acceptable process may be used. In some embodiments, an RCA cleaning process (e.g., using hydrogen peroxide, ammonium hydroxide, and water ($H_2O_2+NH_4OH+H_2O$)) is optionally performed on each of the sacrificial semiconductor layers 112 before depositing a material of the first dielectric layers 114.

Following deposition of each of the first dielectric layers 114, a 2D semiconductor layer 116 is then formed on each of the first dielectric layers 114. 2D semiconductor materials are usually few-layer thick and exist as stacks of strongly bonded layers with weak interlayer van der Waals attraction, allowing the layers to be mechanically or chemically exfoliated into individual, atomically thin layers. The 2D semiconductor materials are promising candidates of the channel, source, drain materials of transistors. Examples of 2D semiconductor materials include transition metal dichalcogenides (TMDs), graphene, layered III-VI chalcogenide, graphene, hexagonal Boron Nitride (h-BN), black phosphorus or the like. The 2D semiconductor may include one or more layers and can have a thickness within the range of about 0.5-100 nm in some embodiments. One advantageous feature of the few-layered 2D semiconductor is the high electron mobility value, which is within a range of about 50-1000 $cm^2$/V-sec or even higher. It is understood that the bulk silicon, when cut to a low thickness (e.g., about 3 nm) comparable with a thickness of a 2D material film, may have its mobility degraded drastically.

In some embodiments, each of the 2D semiconductor layers 116 is a transition metal dichalcogenide (TMD) material which has the formula $MX_2$, wherein M is a transition metal element such as titanium, vanadium, cobalt, nickel, zirconium, molybdenum, technetium, rhodium, palladium, hafnium, tantalum, tungsten, rhenium, iridium, platinum, and X is a chalcogen such as sulfur, selenium, or tellurium. Examples of dichalcogenide materials that are suitable for the 2D semiconductor layer 202 include $WS_2$, $MoS_2$, $WSe_2$, $MoSe_2$, $MoTe_2$, $WTe_2$, the like, or a combination thereof. However, any suitable transition metal dichalcogenide material may alternatively be used. Once formed, the transition metal dichalcogenide material is in a layered structure with a plurality of two-dimensional layers of the general form X-M-X, with the chalcogen atoms in two planes separated by a plane of metal atoms.

Figure 1B:
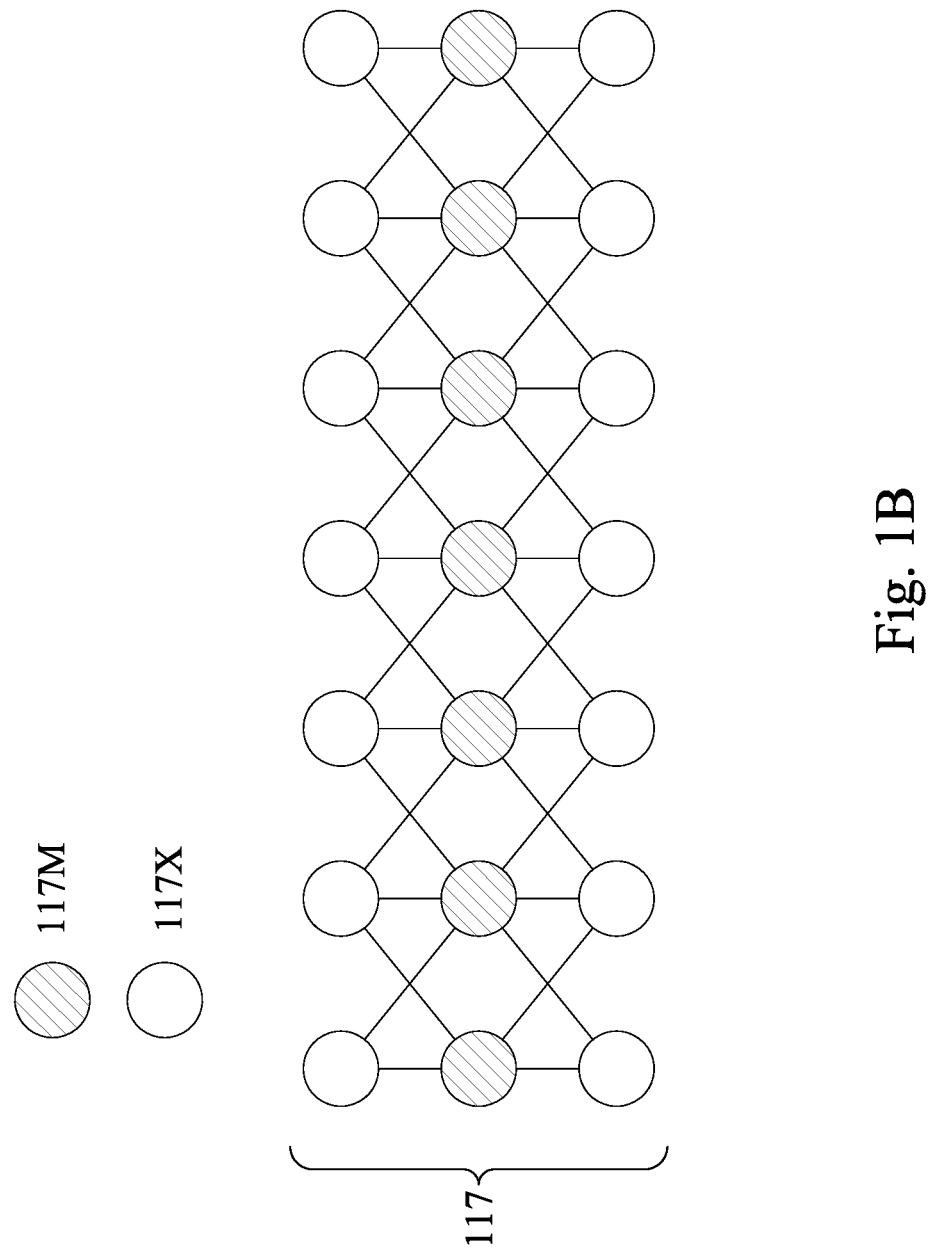
FIG. 1B illustrates a schematic view of a mono-layer of an example TMD in accordance with some embodiments of the present disclosure.

Each of the 2D semiconductor layers 116 may be a mono-layer or may include a few mono-layers. FIG. 1B illustrates a schematic view of a mono-layer 117 of an example TMD in accordance with some example embodiments. In FIG. 1B, the one-molecule thick TMD material layer comprises transition metal atoms 117M and chalcogen atoms 117X. The transition metal atoms 117M may form a layer in a middle region of the one-molecule thick TMD material layer, and the chalcogen atoms 117X may form a first layer over the layer of transition metal atoms 117M, and a second layer underlying the layer of transition metal atoms 117M. The transition metal atoms 117M may be W atoms or Mo atoms, while the chalcogen atoms 117X may be S atoms, Se atoms, or Te atoms. In the example of FIG. 1B, each of the transition metal atoms 117M is bonded (e.g. by covalent bonds) to six chalcogen atoms 117X, and each of the chalcogen atoms 117X is bonded (e.g. by covalent bonds) to three transition metal atoms 117M. Throughout the description, the illustrated cross-bonded layers including one layer of transition metal atoms 117M and two layers of chalcogen atoms 117X in combination are referred to as a mono-layer 117 of TMD.

In some embodiments, the 2D semiconductor layers 116 are formed of $WS_2$ by using an inductively-coupled-plasma (ICP) CVD process with $WF_6$ and $H_2S$ as precursors. For example, the $WS_2$ layers 116 can be deposited on the respective dielectric layers 114 (e.g., $SiO_2$) at a temperature between about 600° C. and about 700° C. (e.g., about 550° C.), using a sulfur-containing gas (e.g., $H_2S$ gas) and a plasma generated from a tungsten-containing gas (e.g., $WF_6$). In some embodiments, the $WS_2$ layer 116 may be deposited to have a thickness in a range from about 0.5 nm to about 10 nm (e.g., about 2 nm). The process conditions are controlled to achieve the desirable total count of monolayers 117 in a $WS_2$ layer. In some embodiments, a plasma treatment using fluorine-based plasma can be performed on each of the first dielectric layers 114 before depositing the 2D semiconductor layers 116, so as to aid in following 2D semiconductor material deposition.

In some other embodiments, each of the 2D semiconductor layers 116 are formed using exfoliation and taping method. For example, a 2D semiconductor layer can be grown on another crystalline substrate by using suitable deposition techniques, and the 2D semiconductor layer is then transferred onto the first dielectric layer 114. For example, the 2D semiconductor layer grown on the crystalline substrate can be covered with a protection film (e.g., PMMA) and a thermal release tape, and then the 2D semiconductor layer is mechanically or chemically exfoliated from the crystalline substrate and then transferred onto the first dielectric layer 114. Next, the thermal release tape can be removed by, for example, baking the thermal release tape, so that the thermal release tape loses adhesiveness. Next, the protection film can be removed by, for example, etching or dissolving. After removal of the protection film, a 2D semiconductor layer 116 remains on the first dielectric layer 114, and is ready for deposition of a second dielectric layer 118.

Figure 6A:
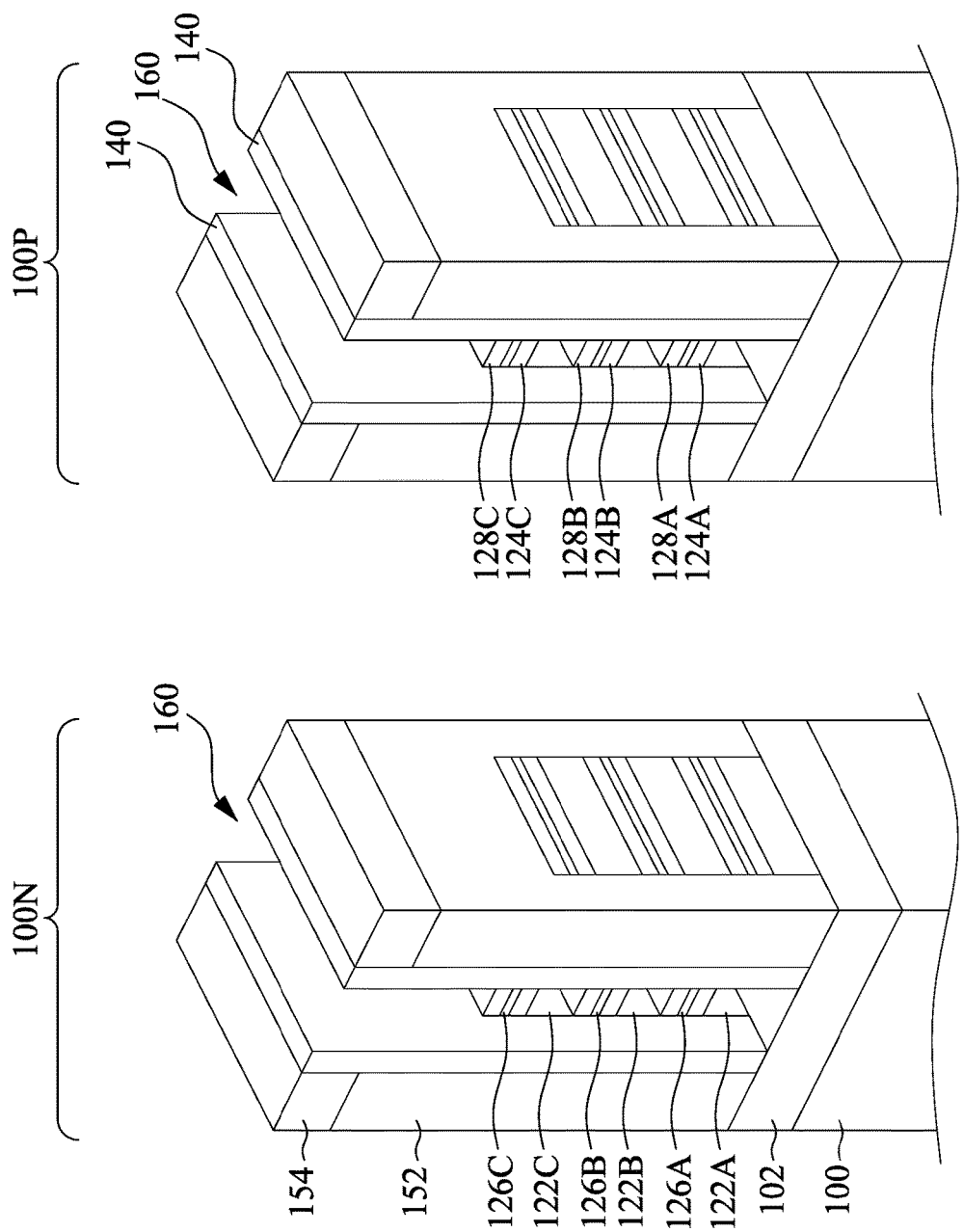
Figure 6B:
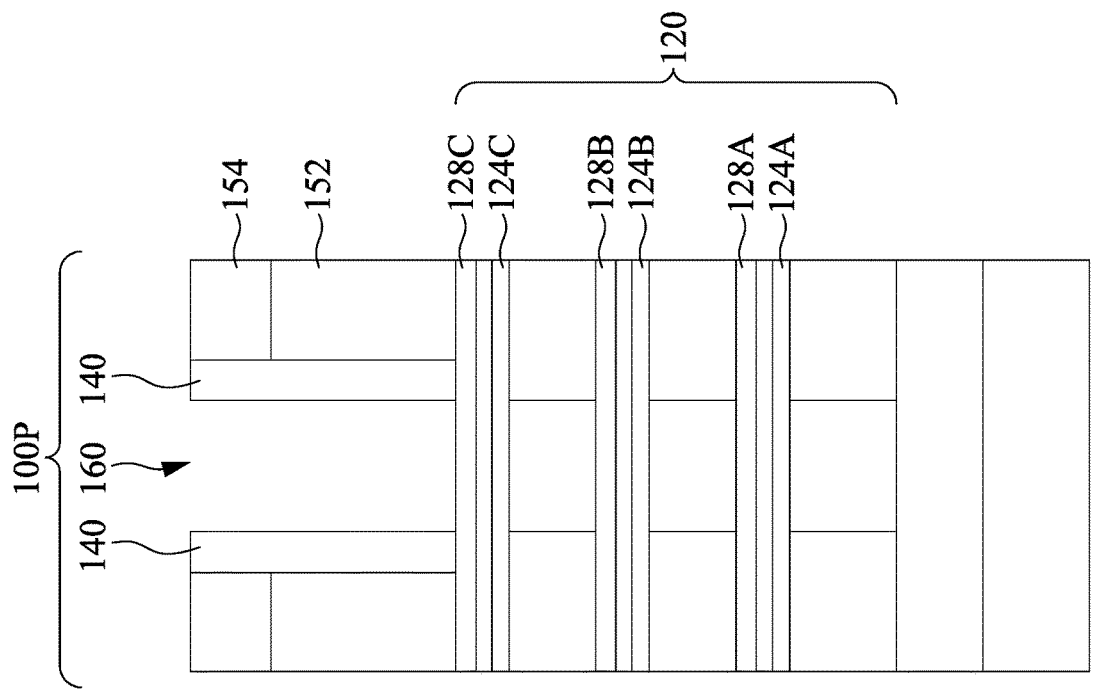
Figure 6B:
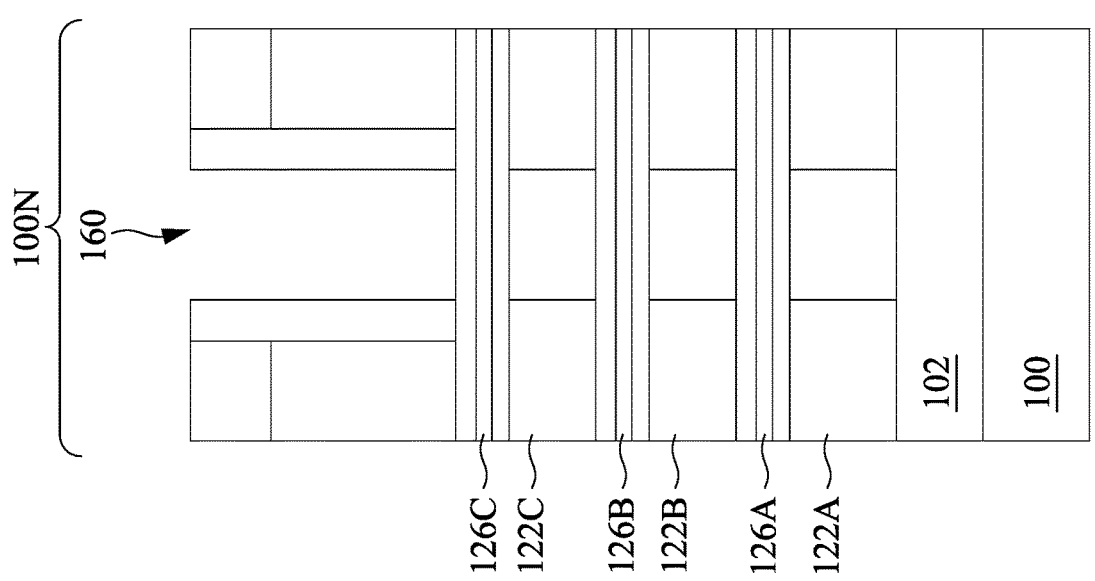

Following deposition of each of the 2D semiconductor layers 116, a second dielectric layer 118 is then deposited on each of the 2D semiconductor layers 116. In some embodiments, the second dielectric layer 118 may be an oxide, such as silicon oxide ($SiO_2$), high-k metal oxide (e.g., $Al_2O_3$), a nitride (e.g., SiN), silicon oxynitride (SiON) the like, or a combination thereof, and may be formed by CVD, ALD, the like, or a combination thereof. Other dielectric materials formed by any acceptable process may be used. In some embodiments, the second dielectric layer 118 has the same material as the first dielectric layer 114. In some other embodiments, the first and second dielectric layers 114 and 118 have different materials. Because 2D semiconductor materials have lower bonding force than dielectric materials such as oxide and/or nitride, the 2D semiconductor materials may be more susceptible to damages and/or oxidation during the subsequent channel release step (as illustrated in FIGS. 6A and 6B), if the first and second dielectric layers 114 and 118 are omitted. Therefore, the first and second dielectric layers 114 and 118 can serve to protect the 2D semiconductor layers 116 from unwanted damages and/or oxidation in the channel release step.

The sacrificial semiconductor layers 112 have a high etch selectivity with respect to the 2D semiconductor layers 116 and the dielectric layers 114, 118. As such, the sacrificial semiconductor layers 112 may be removed without significantly etching the 2D semiconductor layers 116, thereby allowing the 2D semiconductor layers 116 to serve as channel regions of n-type GAA FETs and p-type GAA FETs.

Figure 2A:
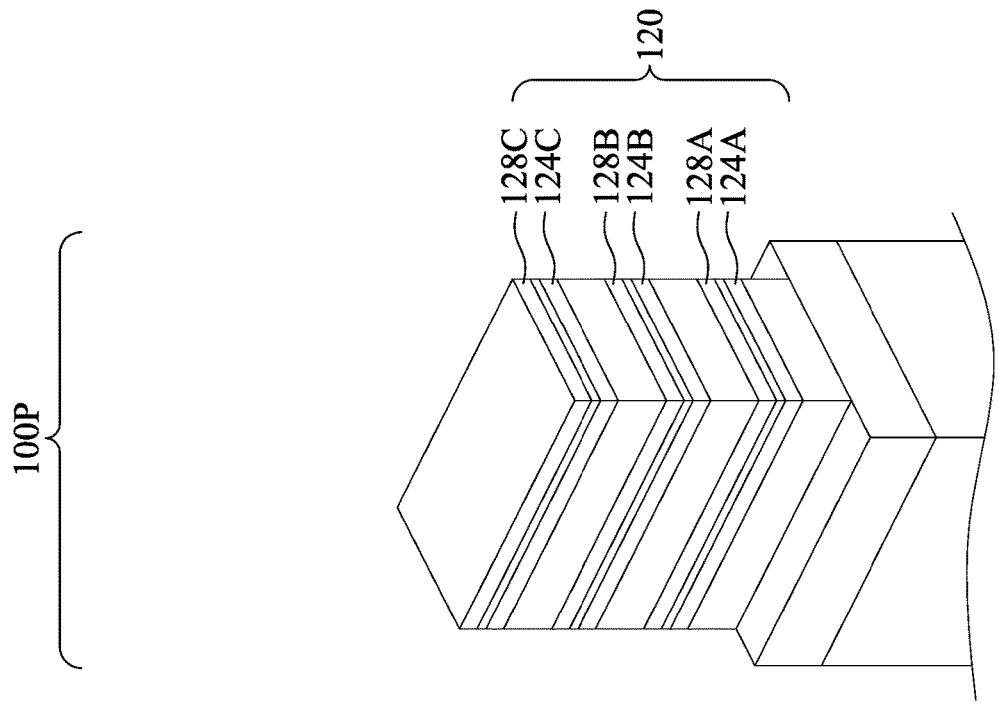
FIGS. 2A, 3A, 4A, 5A, 6A, 7A, 8A, 9A, 10A, 11A, and 12A are perspective views of intermediate stages in fabricating GAA devices in accordance with some embodiments of the present disclosure.
Figure 2A:
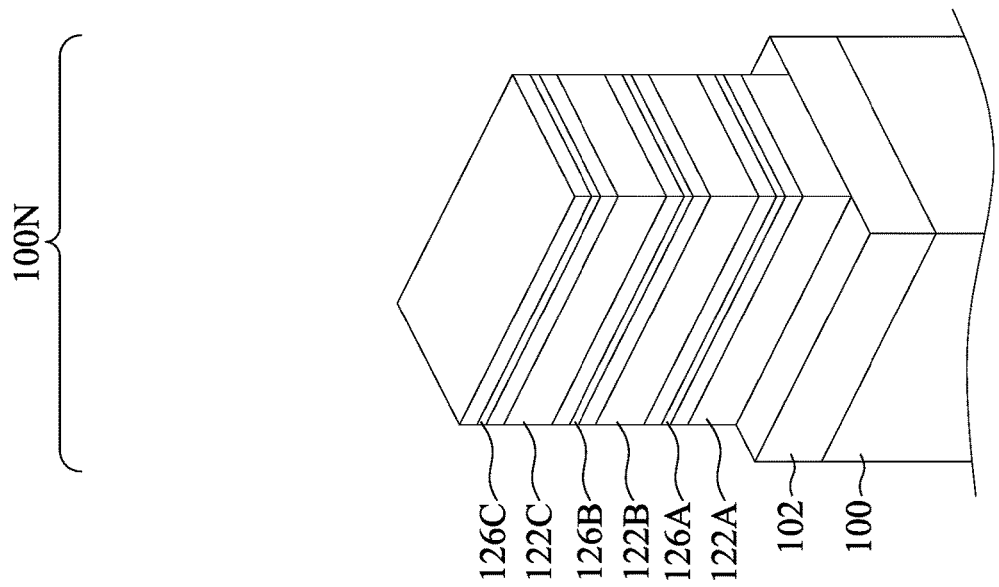
Figure 2B:
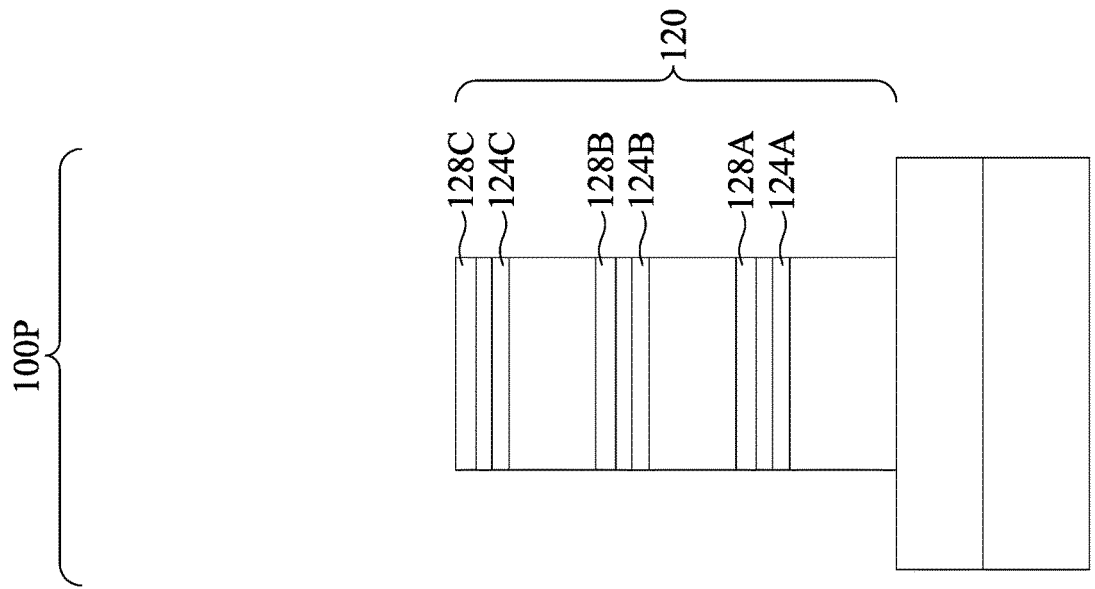
Figure 2B:
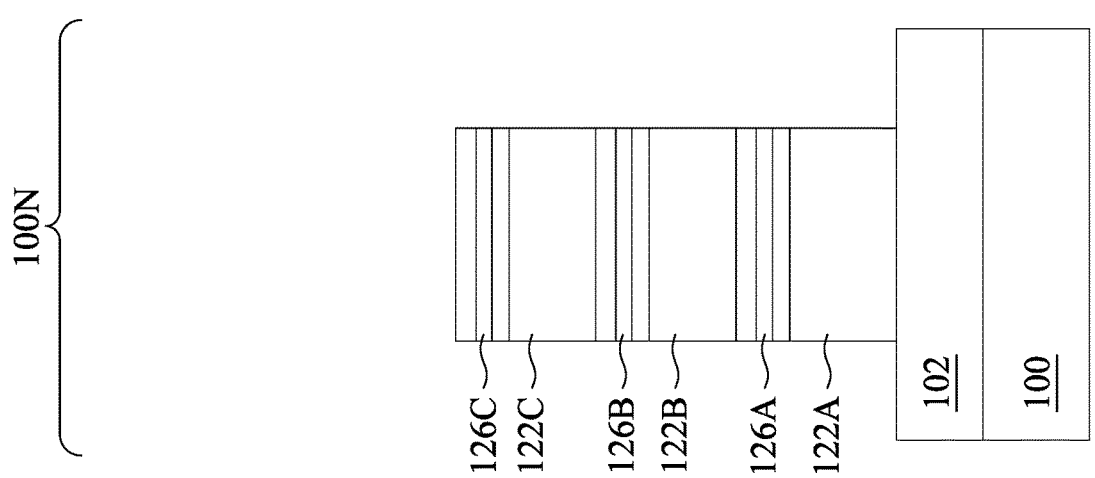

Referring now to FIGS. 2A and 2B, fins 120 are formed in the multi-layer stack 110 by etching trenches in the multi-layer stack 110, in accordance with some embodiments. The etching may be any acceptable etch process, such as a reactive ion etch (RIE), neutral beam etch (NBE), the like, or a combination thereof. The etch stop layer 102 has a higher etch resistance to the etching process than that of the bottommost sacrificial semiconductor layer 112A, and thus the etch stop layer 102 exhibits a slower etch rate than the overlying sacrificial semiconductor layer 112A. In this way, the etch stop layer 102 can act as a detectable etching end point, and thus the etching process can be stopped on the etch stop layer 102. The etching may be anisotropic. Forming the fins 120 by etching the multi-layer stack 110 may further define sacrificial semiconductor nanosheets 122A-C (collectively referred to as the sacrificial semiconductor nanosheets 122) from the sacrificial semiconductor layers 112, define first dielectric nanosheets 124A-C (collectively referred to as the first dielectric nanosheets 124) from the first dielectric layers 114, define 2D semiconductor nanosheets 126A (collectively referred to as 2D semiconductor nanosheets 126A) from the 2D semiconductor layers 116, and define second dielectric nanosheets 128A-C (collectively referred to as second dielectric nanosheets 128) from the second dielectric layers 118. In some embodiments, the nanosheets can be interchangeably referred to as nanostructures.

The fins 120 may be patterned by any suitable method. For example, the fins 120 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 120.

FIGS. 2A-2B illustrate the fins 120 in the n-type device region 100N and the p-type device region 100P as having substantially equal widths for illustrative purposes. In some embodiments, widths of the fins 120 in the n-type device region 100N may be greater or thinner than the fins 120 in the p-type device region 100P. Further, while each of the fins 120 are illustrated as having a consistent width throughout, in other embodiments, the fins 120 may have tapered sidewalls such that a width of each of the fins 120 continuously increases in a direction towards the substrate 100. In such embodiments, each of the nanostructures 122-128 may have a different width and be trapezoidal in shape.

Figure 3A:
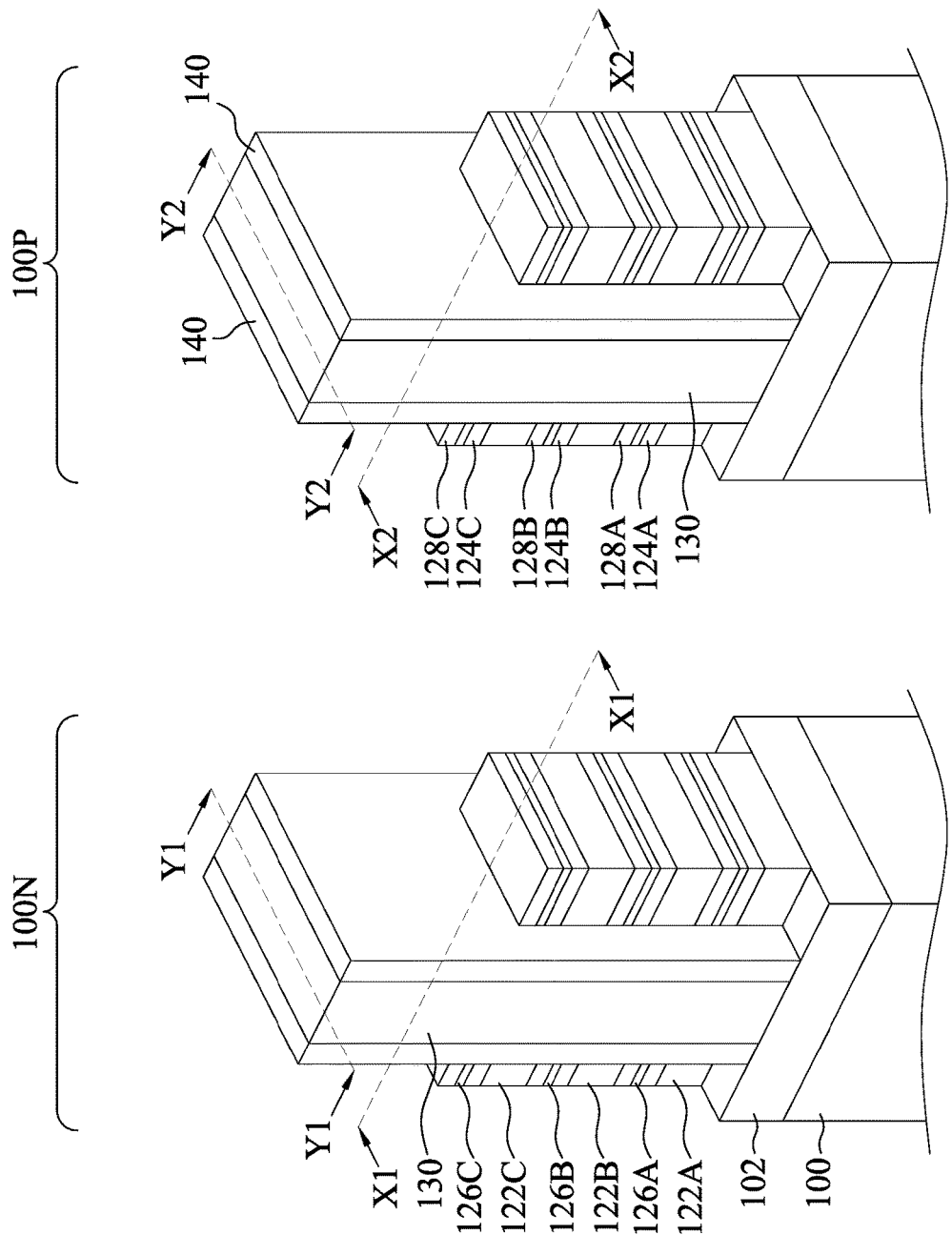
Figure 3B:
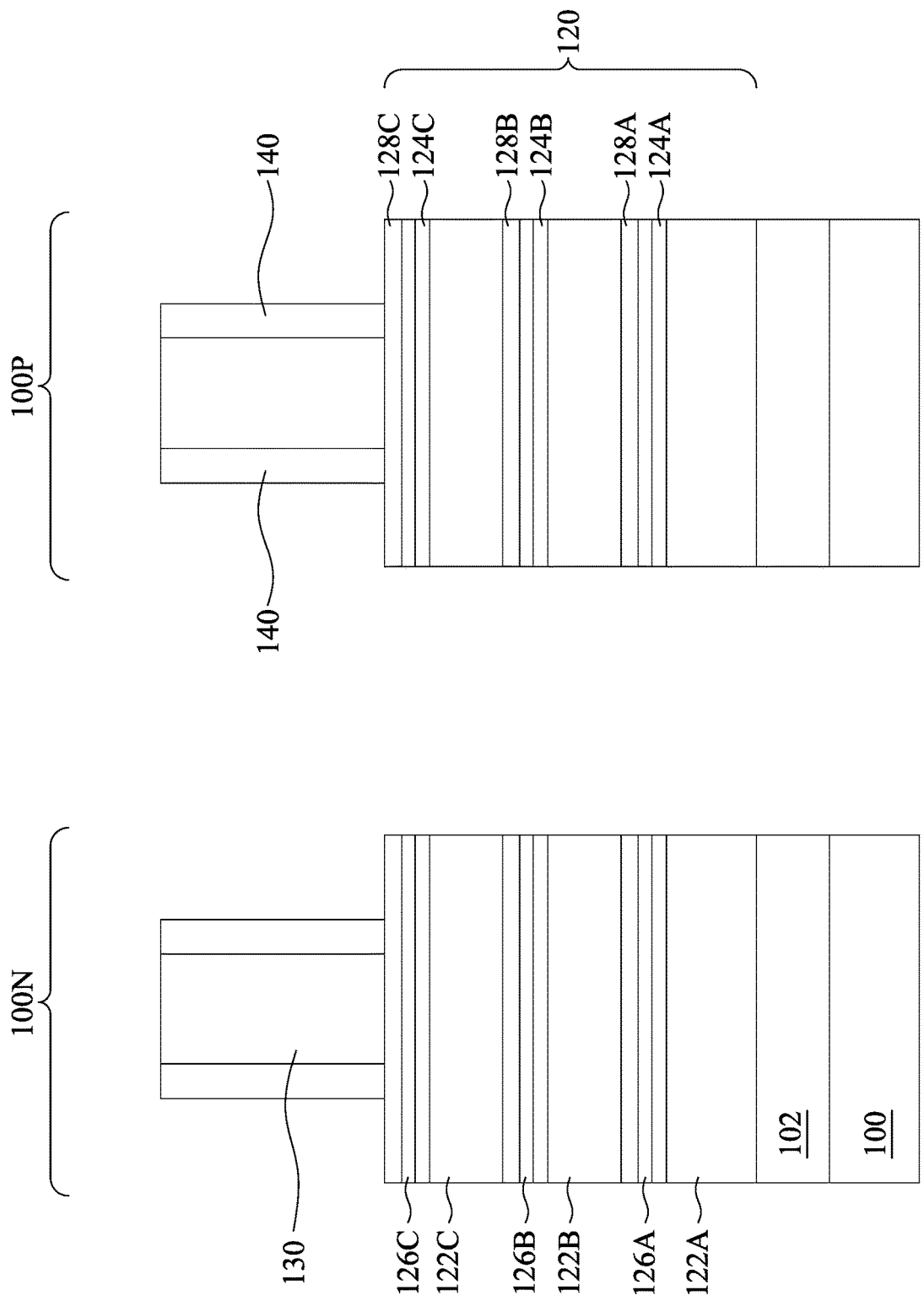

In FIGS. 3A and 3B, dummy gate structures 130 are formed across the fins 120 in the n-type device region 100N and the p-type device region 100P. A material of the dummy gate structures 130 may be deposited over the fins 120 and then planarized, such as by a CMP. Material of the dummy gate structures 130 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The material of dummy gate structures 130 may be deposited by physical vapor deposition (PVD), CVD, sputter deposition, or other techniques for depositing the selected material. In some embodiments, a dummy gate dielectric layer is deposited over the fins 120 prior to deposition of the dummy gate material. In some embodiments, the dummy gate structures 130 are doped polysilicon with an n-type dopant or a p-type dopant. Because the dummy gate structures 130 are doped polysilicon and the sacrificial semiconductor layers 122 are un-doped polysilicon, they can have different etch selectivity and hence different etch rate in the subsequent dummy gate removal step.

Afterwards, the material of dummy gate structures 130 (and dummy gate dielectric, if present) is patterned using acceptable photolithography and etching techniques, so as to form separate dummy gate structures 130. The etch stop layer 102 has a higher etch resistance to the etching process than that of the dummy gate structures 130, and thus the etch stop layer 102 exhibits a slower etch rate than the dummy gate structures 130. In this way, the etch stop layer 102 can act as a detectable etching end point, and thus the etching process can be stopped on the etch stop layer 102. The dummy gate structures 130 cover respective channel regions of the fins 120. The dummy gate structures 130 may also have a lengthwise direction substantially perpendicular to the lengthwise direction of respective fins 120.

FIGS. 3A and 3B also illustrate formation of gate spacers 140. In some embodiments, a spacer material layer is deposited on the substrate. The spacer material layer may be a conformal layer that is subsequently etched back to form gate sidewall spacers 140. In the illustrated embodiment, a spacer material layer is disposed conformally on top and sidewalls of the dummy gate structures 130. The spacer material layer may include a dielectric material such as silicon oxide, silicon nitride, silicon carbide, silicon oxynitride, SiCN, silicon oxycarbide, SiOCN, and/or combinations thereof. The spacer material layer may be formed by depositing a dielectric material over the gate structure 130 using processes such as, CVD process, a subatmospheric CVD (SACVD) process, a flowable CVD process, an ALD process, a PVD process, or other suitable process. An anisotropic etching process is then performed on the deposited spacer material layer to expose portions of the fins 120 not covered by the dummy gate structure 130 (e.g., in source/drain regions of the fins 120). Portions of the spacer material layer directly above the dummy gate structure 130 may be completely removed by this anisotropic etching process. Portions of the spacer material layer on sidewalls of the dummy gate structure 130 may remain, forming gate sidewall spacers, which is denoted as the gate spacers 140, for the sake of simplicity.

Figure 4A:
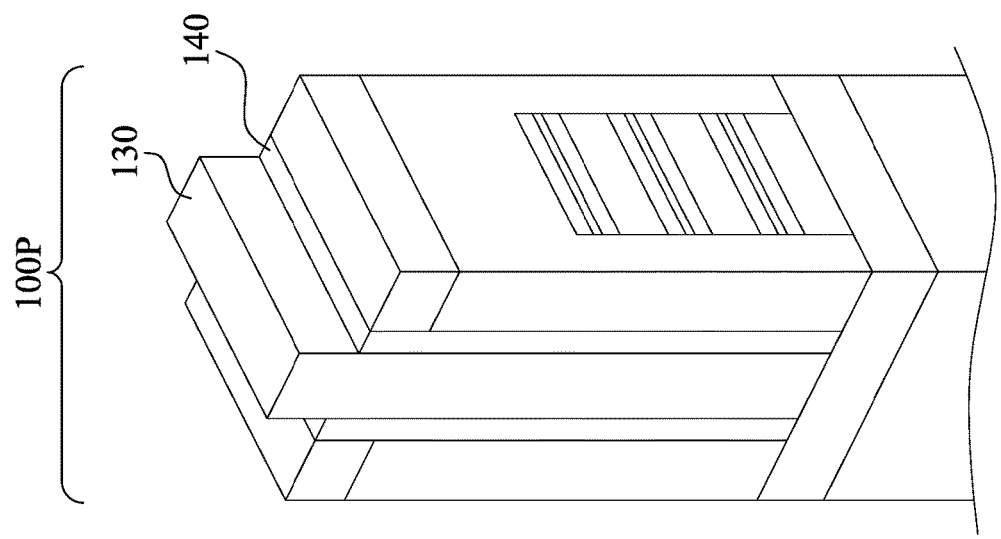
Figure 4A:
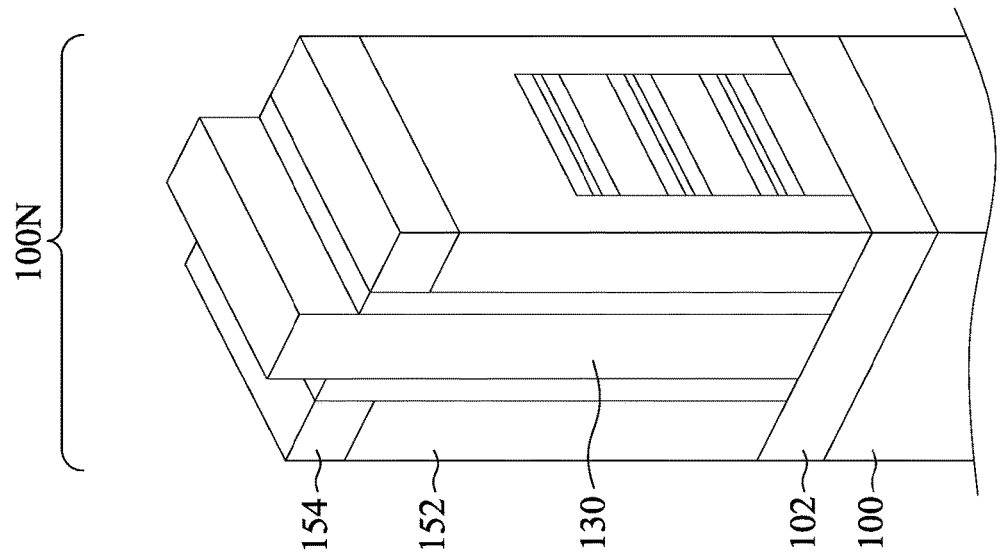
Figure 4B:
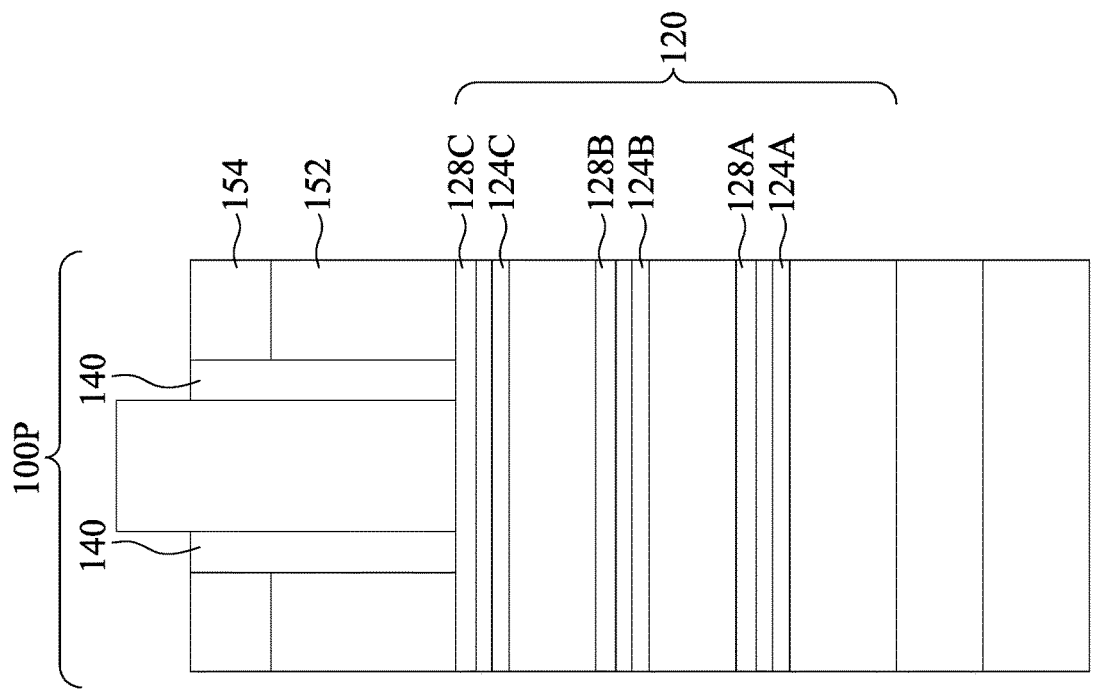
Figure 4B:
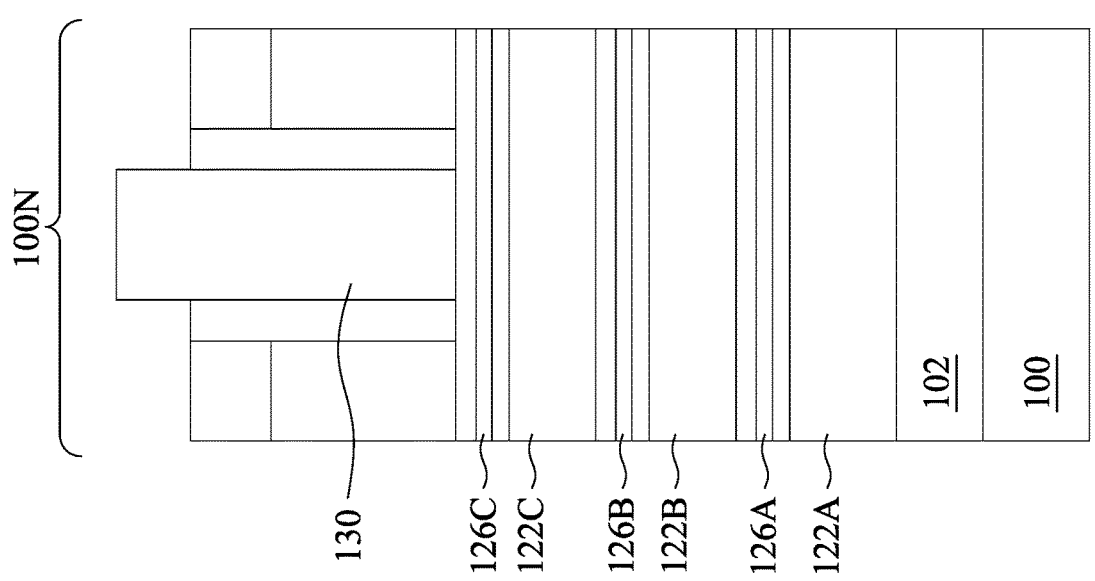

In FIGS. 4A and 4B, a first source/drain cap layer 152 is formed over source/drain regions of the fins 120, and a second source/drain cap layer 154 is then formed over the first source/drain cap layer 152. The first and second source/drain cap layers 152 and 154 include a dielectric material such as silicon oxide, silicon nitride, silicon oxynitride, SiCN, silicon oxycarbide, or other suitable dielectric materials, deposited using a CVD process, a flowable CVD process, an ALD process, or other suitable process. An etching process is then carried out to etch back the second source/drain cap layer 154 to fall below top surfaces of the dummy gate structures 130. In some embodiments, the gate spacers 140 are also etched back by this etching step to become lower than the dummy gate structures 130. In some embodiments, the second source/drain cap layer 154 is formed of a different material than the first source/drain cap layer 152 to provide etch selectivity. In some embodiments, the second source/drain cap layer 154 is formed of a same material as the gate spacers 140. For example, the gate spacers 140 and the second source/drain cap layer 154 are both nitride-based materials (e.g., SiN, SiON or the like), and the first source/drain cap layer 152 is oxide-based material (e.g., $SiO_2$, $Al_2O_3$, or the like).

Figure 5A:
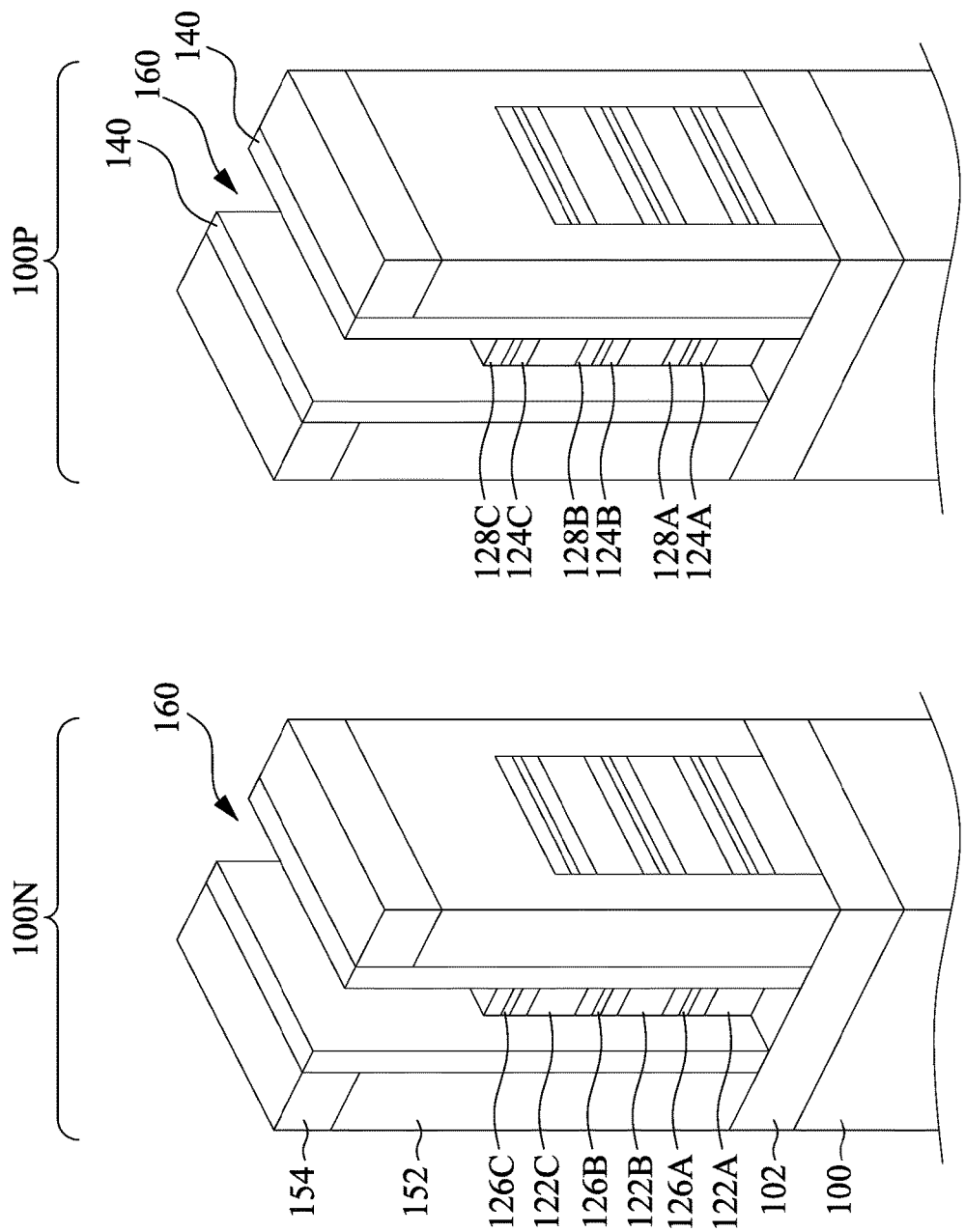
Figure 5B:
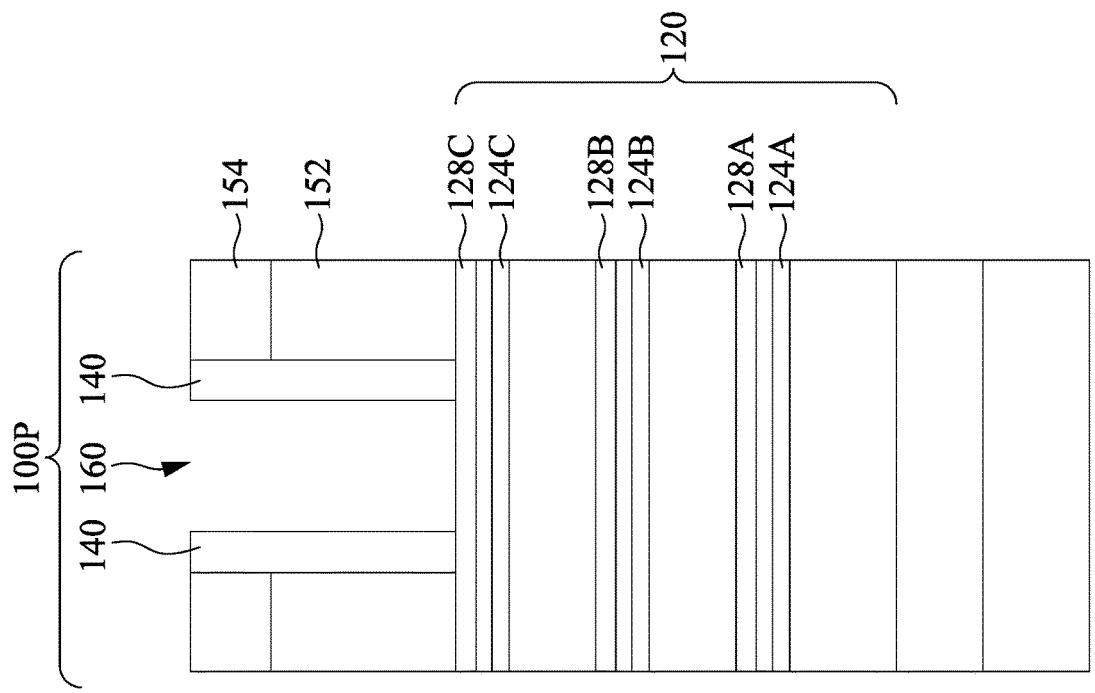
Figure 5B:
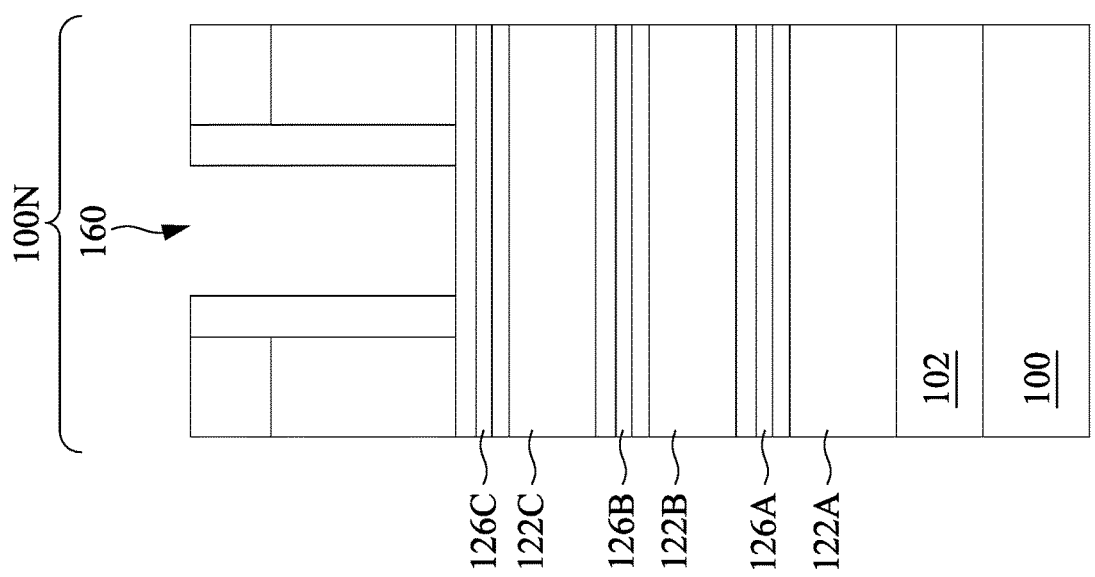

In FIGS. 5A and 5B, the dummy gate structures 130 (and dummy gate dielectrics if present) are removed in one or more etching steps, so that gate trenches 160 are formed between corresponding gate spacers 140. In some embodiments, the dummy gate structures 130 are removed by an anisotropic dry or wet etch process. For example, the etching process may include a dry etch process using reaction gas(es) that selectively etch the dummy gate structures 130 at a faster rate than the gate spacers 140, the second source/drain cap layer 154 and the second dielectric nanosheets 128. Moreover, the directionality of the anisotropic etching is controlled to allow a significant etch rate in vertical direction but no or negligible etch rate in lateral or horizontal direction. In this way, the dummy gate removal etching step can result in no or negligible loss in the sacrificial semiconductor nanosheets 122, the 2D semiconductor nanosheets 126, and the first, second dielectric nanosheets 124, 128. Moreover, in some embodiments, the sacrificial semiconductor layers 122 have a etch selectivity with respect to the dummy gate structures 130, because the dummy gate structures 130 are doped polysilicon while the sacrificial semiconductors 122 are un-doped polysilicon. The etch selectivity thus further aids in keeping the polysilicon nanosheets 122 intact during the dummy gate removal step.

Each gate trench 160 exposes and/or overlies portions of 2D semiconductor nanosheets 126, which act as channel regions in subsequently completed GAA-FETs. The 2D semiconductor nanosheets 126 which act as the channel regions are disposed between neighboring pairs of the first source/drain cap layers 152. In some embodiments, the etch stop layer 102 has a higher etch resistance to that of the dummy gate structures 130, and thus the etch stop layer 102 exhibits a slower etch rate than the dummy gate structures 130. In this way, the etch stop layer 102 can act as a detectable etching end point, and thus the etching process can be stopped on the etch stop layer 102.

In FIGS. 6A and 6B, portions of the sacrificial semiconductor nanosheets 122 in the gate trenches 160 are removed by an isotropic etching process such as wet etching or the like using etchants which are selective to the materials of the sacrificial semiconductor nanosheets 122. Stated differently, the sacrificial semiconductor nanosheets 122 in the gate trenches 160 are removed by using a selective etching process that etches the sacrificial semiconductor nanosheets 122 at a faster etch rate than it etches the first, second dielectric nanosheets 124, 128, and the 2D semiconductor nanosheets 126, thus forming spaces between the 2D semiconductor nanosheets 126 (also called sheet-sheet spaces). This step can be referred to as a channel release process. At this interim processing step, the spaces between 2D semiconductor nanosheets 126 may be filled with ambient environment conditions (e.g., air, nitrogen, etc). In some embodiments where the sacrificial semiconductor nanosheets 122 are polysilicon, they can be removed using a selective wet etching process using hydroxide containing solution (e.g., ammonium hydroxide), deionized water, and/or other suitable solutions as the etchant that attacks polysilicon, and hardly attacks other materials, such as materials of the dielectric nanosheets 124, 128 and/or the 2D semiconductor nanosheets 126.

The 2D semiconductor materials of the 2D semiconductor nanosheets 126 have lower bonding force than dielectric materials of the first and second dielectric nanosheets 124, 128, and thus the 2D semiconductor nanosheets 126 may be more susceptible to damages and/or oxidation in absence of the first and second dielectric nanosheets 124, 128. However, because the first and second dielectric nanosheets 124, 128 are formed sandwiching the 2D semiconductor nanosheets 126 before the channel release step, the first and second dielectric nanosheets 124, 128 can protect the 2D semiconductor nanosheets 126 from unwanted damages and/or oxidation in the channel release step, which in turn improves yield of the GAA devices.

Figure 7A:
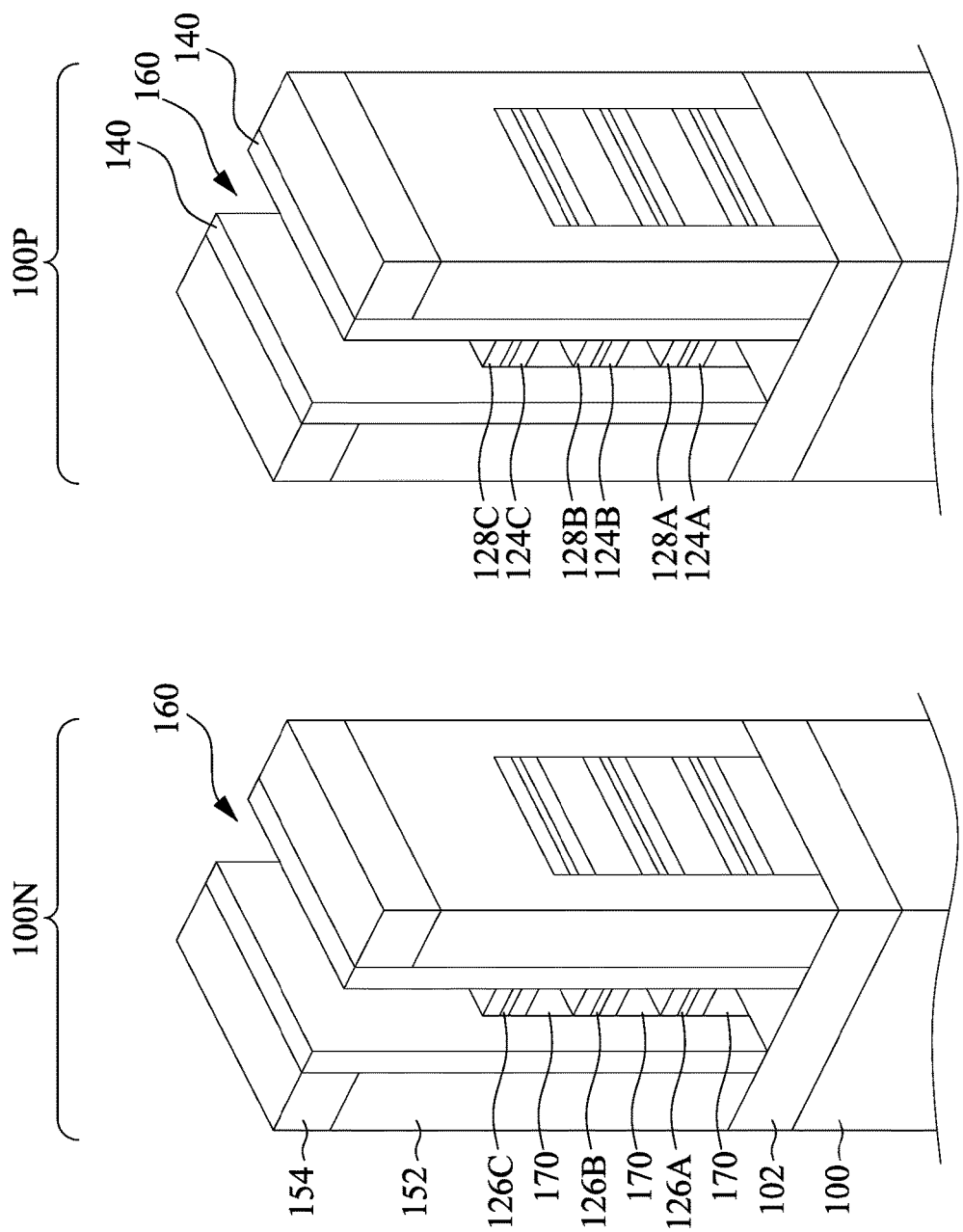
Figure 7B:
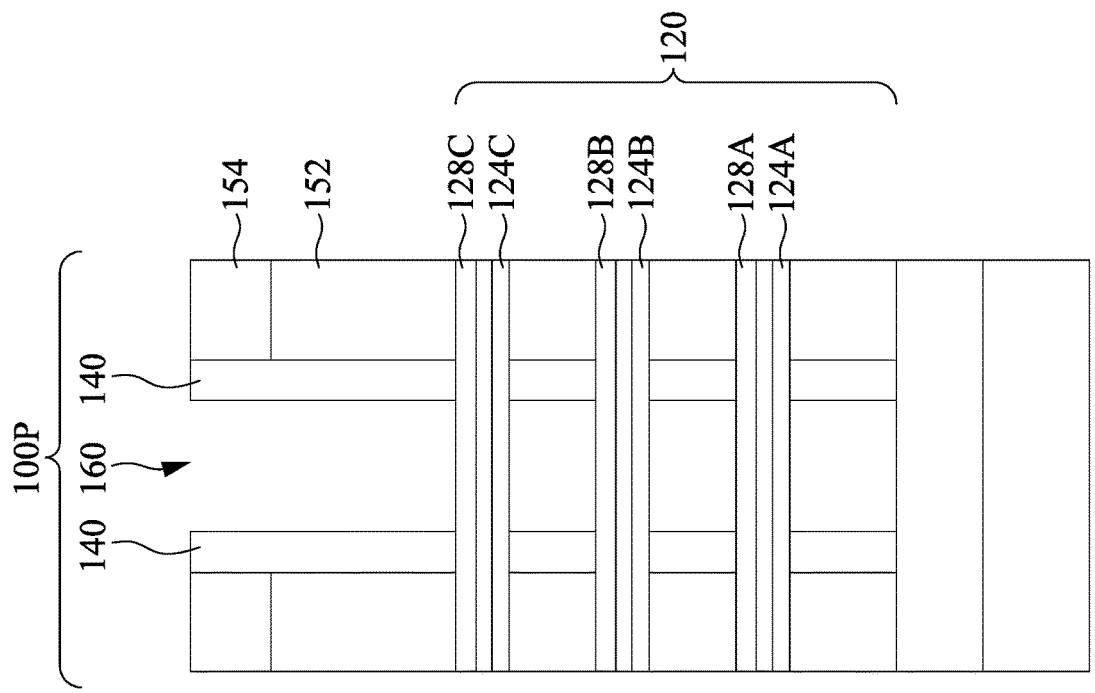
Figure 7B:
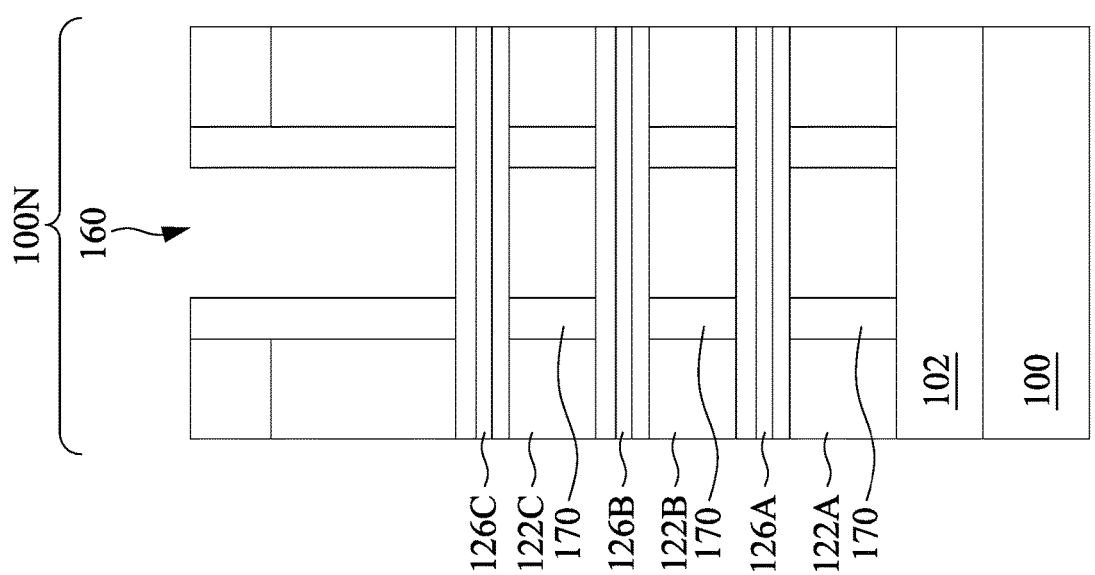

In FIGS. 7A and 7B, inner spacers 170 are formed by oxidizing portions of the sacrificial semiconductor nanosheets 122 that are exposed in the gate trenches 160. As a result, when the sacrificial semiconductor layers 122 are polysilicon, the inner spacers 170 are silicon oxide formed from oxidizing the polysilicon. In some embodiments, the sacrificial semiconductor nanosheets 122 are oxidized by using a selective oxidation process that oxidizes the polysilicon of the sacrificial semiconductor nanosheets 122 at a faster oxidation rate than it oxidizes the 2D semiconductor materials of the 2D semiconductor nanosheets 126. As a result, the selective oxidation process can oxidize exposed portions of sacrificial semiconductor nanosheets 122 while result in no or negligible oxidation in the 2D semiconductor nanosheets 126. Therefore, the selective oxidation process has no or negligible impact on yield of the GAA devices. Moreover, inner spacer fabrication steps in general GAA devices involves selectively etching SiGe layers to form recesses on end surface of the SiGe layers, depositing a dielectric layer in the recesses of the SiGe layers, and then etching the dielectric layer to expose Si channel layers. As compared with such complex fabrication steps, the inner spacers 170 of the present disclosure can be formed by using a single oxidation step without additional etching and deposition steps, which in turn simplifies inner spacer formation.

Figure 8A:
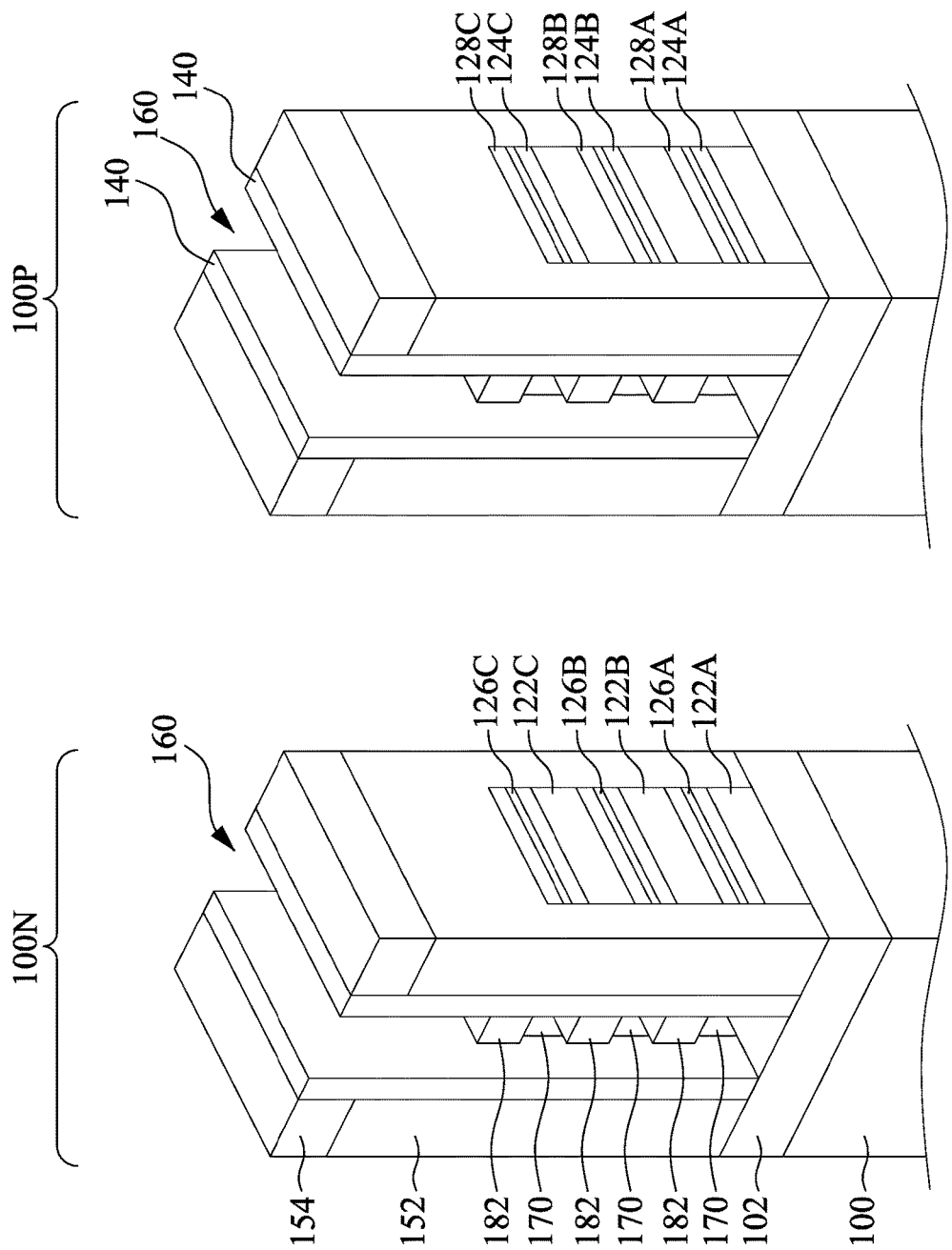
Figure 8B:
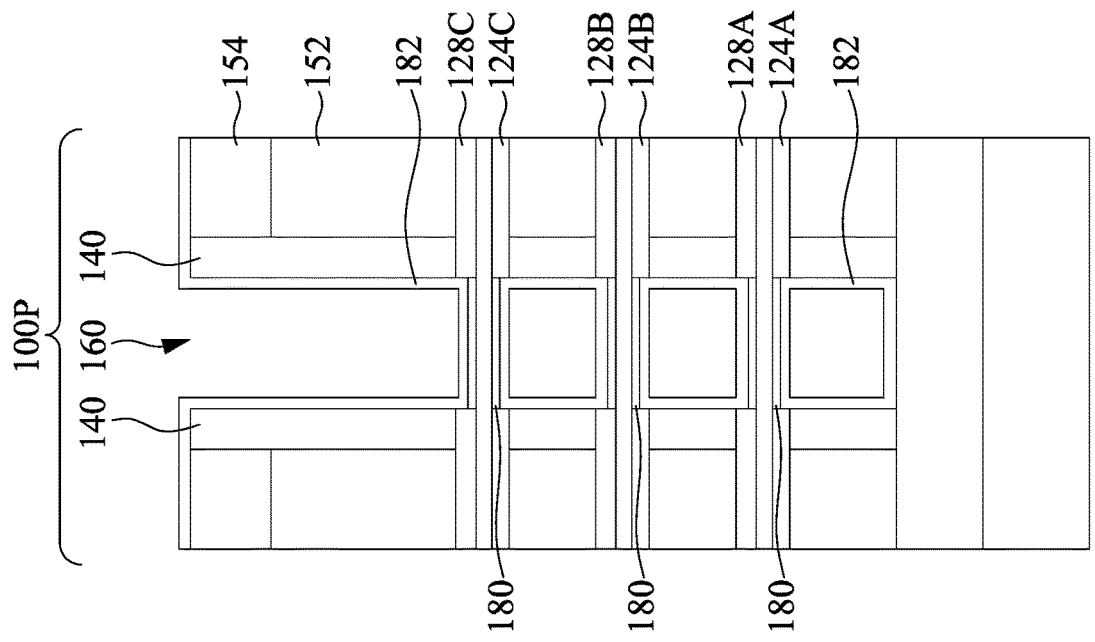
Figure 8B:
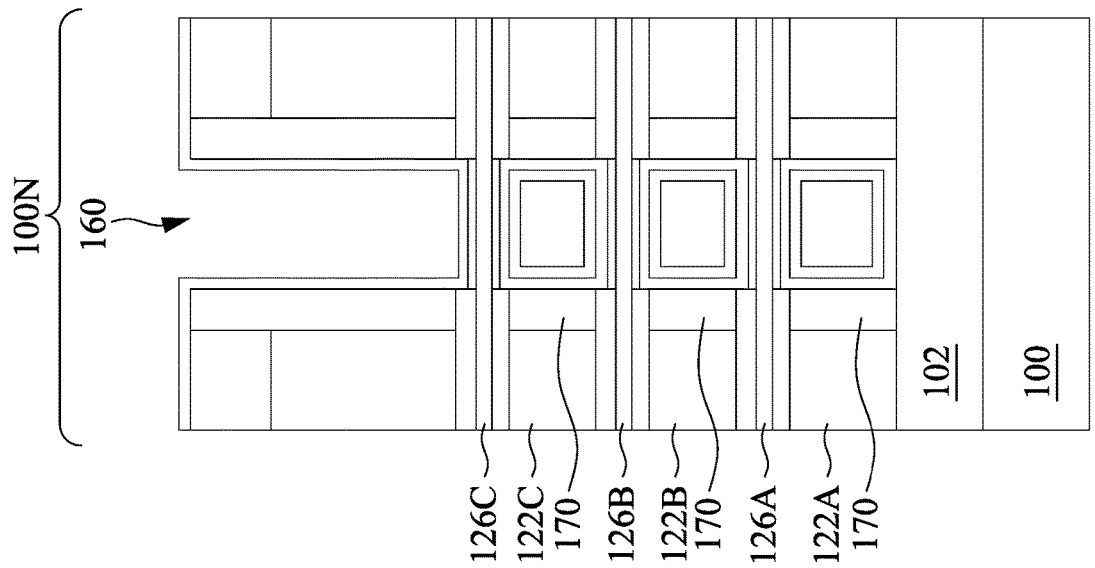

In FIGS. 8A and 8B, according to some embodiments of the present disclosure, portions of the first and second dielectric nanosheets 124 and 128 exposed in the gate trenches 160 are removed by one ore more elective etching processes to expose the 2D semiconductor nanosheets 126, and a gate dielectric layer 182 is then deposited conformally in the gate trenches 160 in both the n-type device region 100N and the p-type device region 100P. It is understood that 2D semiconductor materials generally have no dangling bonds, and therefore it would be challenging to deposit dielectric materials onto suspended 2D semiconductor nanosheets 126 in absence of the dangling bonds on 2D material surfaces. However, it is appreciated that as the etchant of removing the dielectric nanosheets 124 and 128 comes in contact with the 2D semiconductor nanosheets 126, more dangling bonds on top and bottom surfaces of each 2D semiconductor nanosheet 126 are created, and thus more nucleation sites may be available for absorption and nucleation of dielectric materials, which in turn aids in depositing dielectric materials onto the top and bottom surfaces of each 2D semiconductor nanosheet 126.

In some embodiments, interfacial layers 180 are formed around each 2D semiconductor nanosheet 126 before globally depositing the gate dielectric layer 182 over the n-type device region 100N and the p-type device region 100P. In some embodiments, the interfacial layer includes oxide materials (e.g., $SiO_2$, $HfO_2$, $WO_x$, or the like), oxynitride materials (e.g., SiON, HfON, or the like), nitride materials (e.g., SiN, AlN), or other suitable materials. In some embodiments, the interfacial layers 180 are transition metal oxide including, for example, tungsten oxide ($WO_3$), molybdenum oxide (MoO) or other suitable transition metal oxide materials, formed using techniques such as thermal oxidation, chemical oxidation or deposited by CVD, ALD, or the like.

In some embodiments where the interfacial layers 180 are formed using oxidation, surface layers of TMD materials of the 2D semiconductor nanosheets 126 are oxidized into the interfacial layers 180. In that case, the interfacial layers 180 have a same transition metal composition as the 2D semiconductor nanosheets 126, such as tungsten or molybdenum. For example, when the 2D semiconductor nanosheets 126 are $WS_2$, the interfacial layers 180 can be tungsten oxide ($WO_3$). In some embodiments where the interfacial layers 180 are formed from oxidation, the interfacial layers 180 are localized to surfaces of the 2D semiconductor nanosheets 126, and may not extend to dielectric surfaces, such as the surfaces of the gate spacers 140, inner spacers 170, second source/drain cap layer 154, and the etch stop layer 102. On the contrary, because the gate dielectric layer 182 is formed using a deposition technique, all exposed surfaces (including the surfaces of the interfacial layers 180, the gate spacers 140, inner spacers 170, second source/drain cap layer 154, and the etch stop layer 102) may be deposited with the gate dielectric layer 182, as illustrated in FIG. 8B. It is understood that although the gate dielectric layer 182 globally covers all exposed surfaces in both the n-type device region 100N and the p-type device region 100P in the cross-sectional view of FIG. 8B, it is illustrated merely around the 2D semiconductor nanosheets in the perspective view of FIG. 8A for the sake of simplicity and clarity.

In some embodiments, the gate dielectric layer 182 includes one or more high-k dielectric layers. High-k gate dielectrics, as used and described herein, include dielectric materials having a high dielectric constant, for example, greater than that of thermal silicon oxide (about 3.9-4.0). The high-k dielectric material of the gate dielectric layer 182 may include, by way of example and not limitation, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide ($La_2O_3$), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

In some embodiments, the gate dielectric layer 182 in the n-type device region 100N may have a different material composition than that in the p-type device region 100P, so as to meet threshold voltage (Vt) targets for the n-type GAA device and the p-type GAA device. For example, the gate dielectric layer 182 in the n-type device region 100N may include more or fewer high-k dielectric films than that in the p-type device regions 100P. Such gate dielectric difference can be achieved by depositing in sequence a first high-k dielectric film and a second high-k dielectric film globally over the n-type device region 100N and the p-type device region 100P, followed by removing a portion of the second high-k dielectric film from the n-type device region 100N or the p-type device region 100P using suitable photolithography and etching techniques.

Figure 8C:
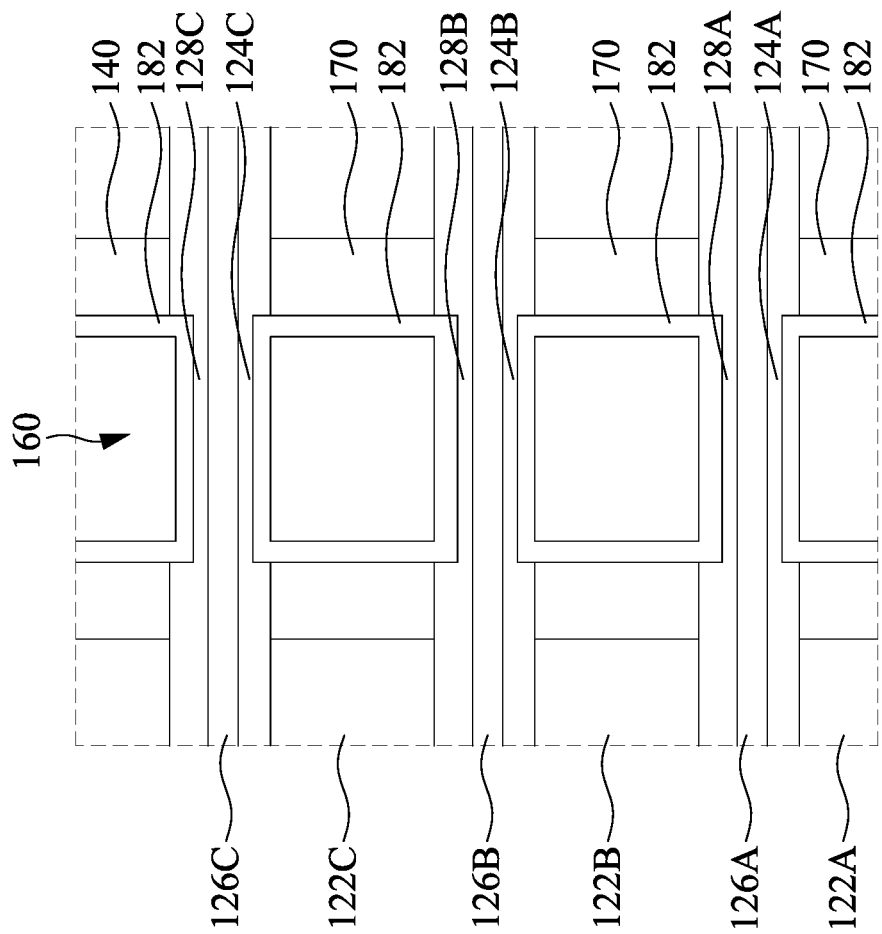

FIG. 8C is a zoomed-in view illustrating some other embodiments of the present disclosure about fabricating the gate dielectric layer 182. In FIG. 8C, portions of the first and second dielectric nanosheets 124 and 128 remain on surfaces of the 2D semiconductor nanosheets 126 in the gate trench 160, instead of being replaced with interfacial layers 180 as illustrated in FIG. 8B. The remaining dielectric nanosheets 124 and 128 in the gate trench 160 provide benefits for depositing the gate dielectric layer 182, because it is challenging to deposit dielectric materials on the 2D semiconductor nanosheets 126 due to absence of dangling bonds on 2D semiconductor surfaces. In some embodiments, the structure as illustrated in FIG. 8C can be achieved by, for example, thinning down the dielectric nanosheets 124 and 128 in the gate trench 160 in both the n-type device region 100N and the p-type device region 100P by etching (instead of completely removing them from the gate trench 160), followed by conformally depositing the gate dielectric layer 182 in the gate trench 160 in both the n-type device region 100N and the p-type device region 100P.

Figure 9A:
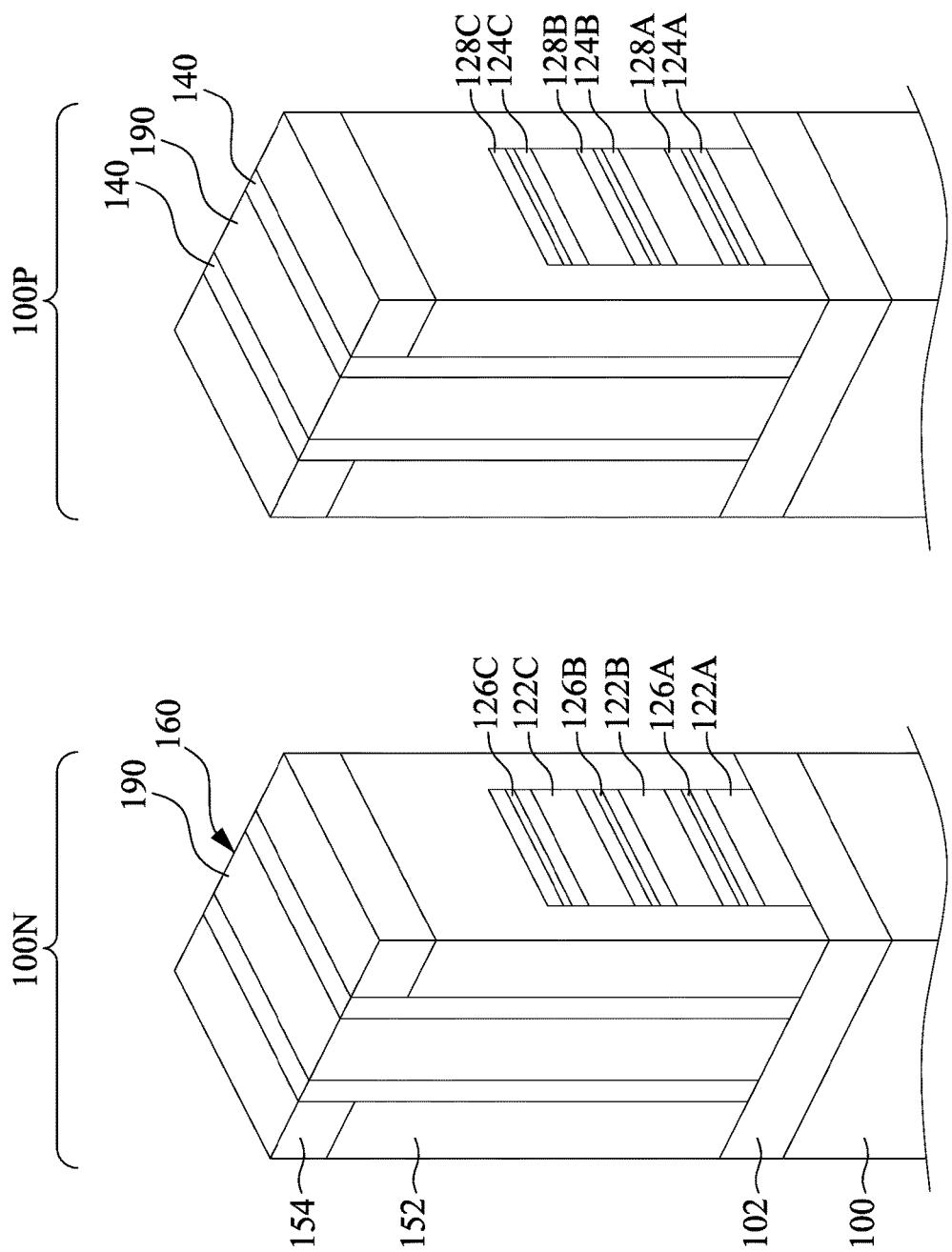
Figure 9B:
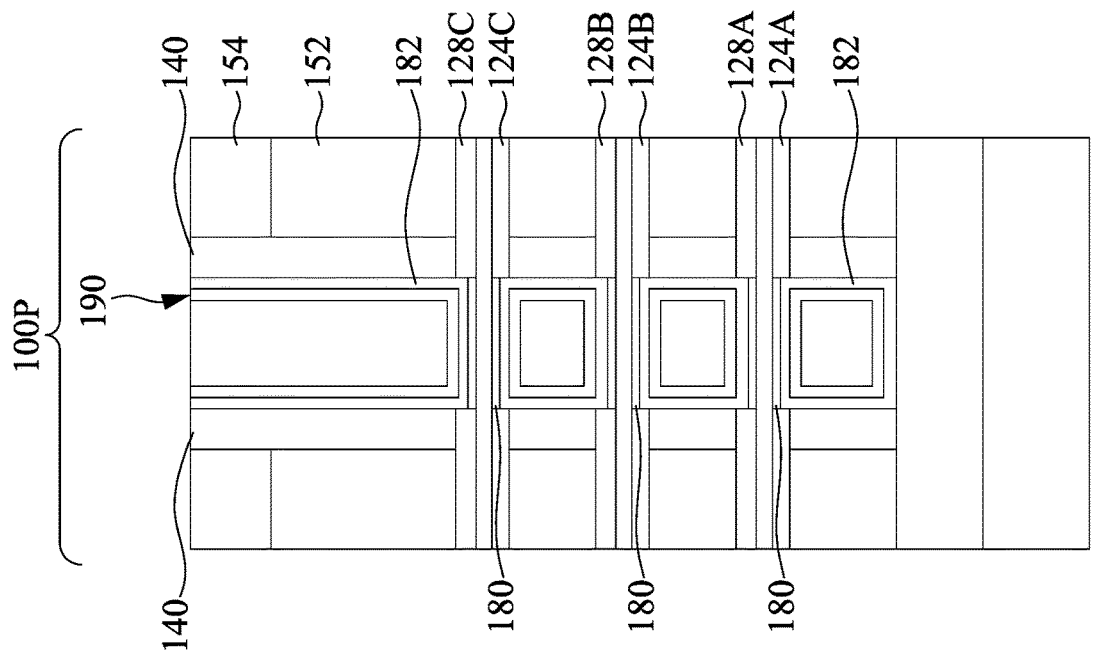
Figure 9B:
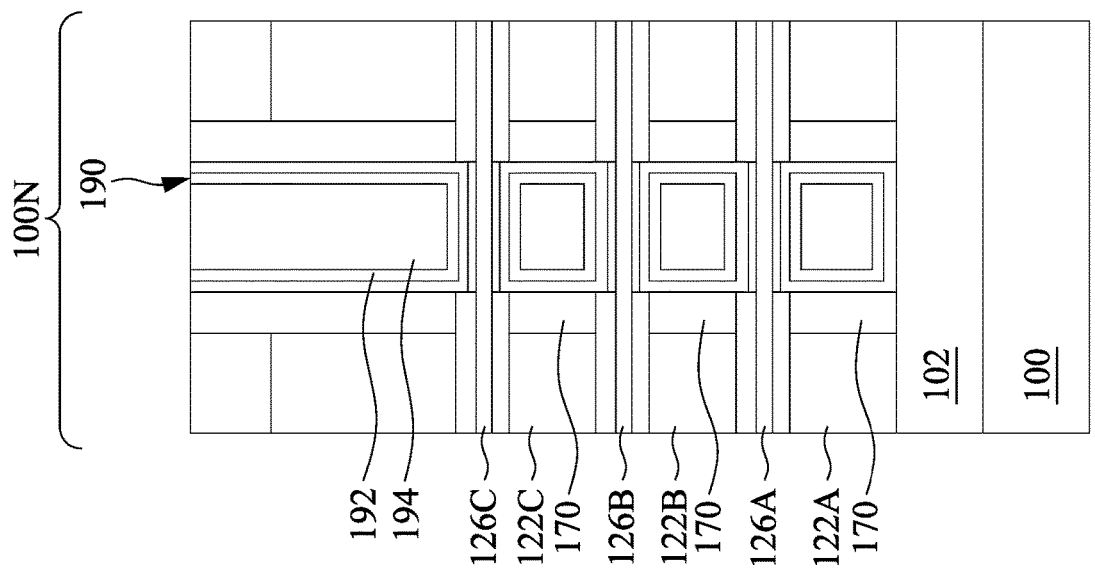
Figure 9C:
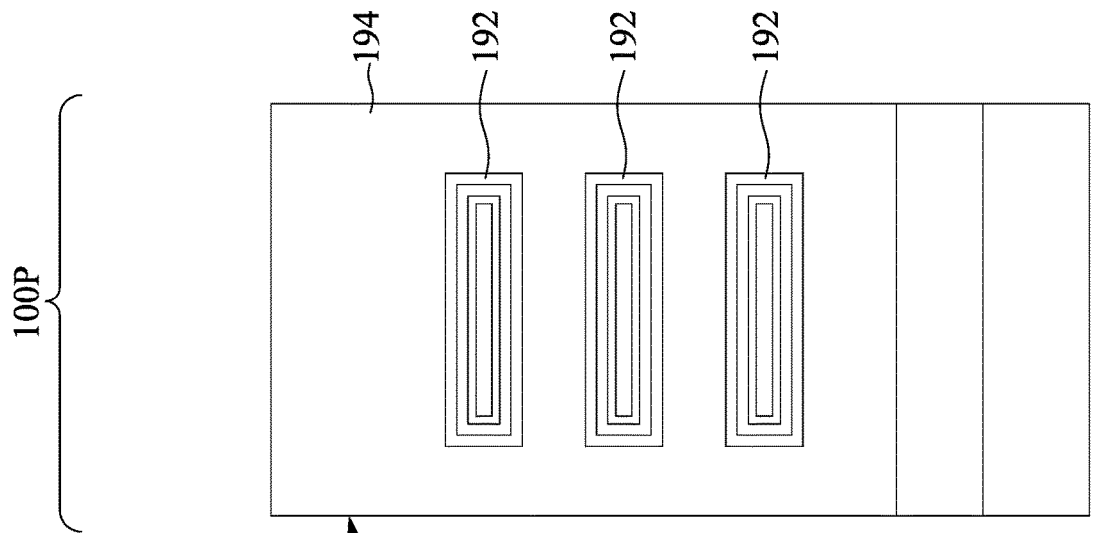
FIGS. 9C and 10C are cross-sectional views of intermediate stages in fabricating GAA devices in accordance with some embodiments of the present disclosure, wherein each of the cross-sectional views combines a cross-sectional view obtained from a third cut along a longitudinal axis of a gate structure of the n-type transistor and a cross-sectional view obtained from a fourth cut along a longitudinal axis of a gate structure of the p-type transistor.
Figure 9C:
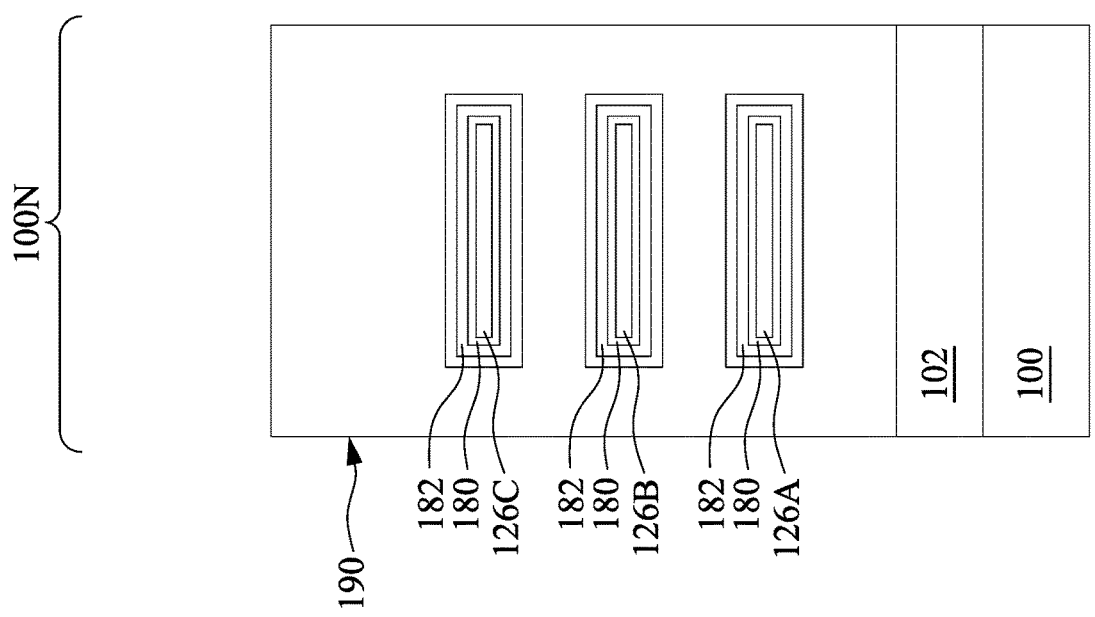

In FIGS. 9A-9C, replacement gate structures 190 are formed to fill the gate trenches 160 in the n-type device region 100N and the p-type device region 100P. In some embodiments, as illustrated in FIG. 9B, one or more work function metal layers 192 are deposited on the gate dielectric layer 182 in the n-type device region 100N and the p-type device region 100P, followed by depositing a fill metal 194 on the one or more work function metal layers 192 to fill a remainder of gate trenches 160 in the n-type device region 100N and the p-type device region 100P. A CMP is then performed on the fill metal 194 until the gate spacers 140 and the second source/drain capping layer 154 are exposed, resulting in the fill metal 194, the one or more work function metal layers 192, the gate dielectric layer 182, the gate spacers 140, and the second source/drain capping layer 154 having substantially level top surfaces. Each replacement gate structure 190 includes interfacial layers 180 respectively surrounding the 2D semiconductor nanosheets 126, a gate dielectric layer 182 surrounding each of the interfacial layers 180, one or more work function metal layers 192 surrounding the gate dielectric layer 182, and a fill metal 194 surrounding the one of more work function metal layers 192.

In some embodiments, a number of work function metal layer 192 in the n-type device region 100N is the same as a number of the work function metal layer 192 in the p-type device region 100P, if the gate dielectric composition difference achieves satisfactory threshold voltage tuning targets for both n-type and p-type devices. In some other embodiments, a number of the work function metal layer 192 in the n-type device region 100N may be more or fewer than a number of the work function metal layer 192 in the p-type device region 100P, so as to further aid in threshold voltage tuning. Gate stacks having different numbers of work function metal layers 192 may be fabricated using suitable deposition, photolithography and etching processes. For example, a first work function metal layer and a second work function metal layer are globally over the n-type device region 100N and the p-type device region 100P, followed by removing a portion of the second work function metal layer from the n-type device region 100N or the p-type device region 100P using suitable photolithography and etching techniques.

The one or more work function metal layers 192 may include one or more work function metals to provide a suitable work function for the high-k/metal gate (KHMG) structures. For an n-type GAA FET, the one or more work function metal layers 192 may include one or more n-type work function metals (N-metal), which has a work function lower than a mid-gap work function of the 2D semiconductor material (e.g., TMD) of the 2D semiconductor nanosheets 126 that is in the middle of the valance band and the conduction band of the 2D semiconductor material. The n-type work function metals may exemplarily include, but are not limited to, nickel (Ni), titanium (Ti), titanium aluminide (TiAl), titanium aluminium nitride (TiAlN), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type GAA FET, the one or more work function metal layers 192 may include one or more p-type work function metals (P-metal), which has a work function higher than the mid-gap work function of the 2D semiconductor material (e.g., TMD) of the 2D semiconductor nanosheets 126. The p-type work function metals may exemplarily include, but are not limited to, palladium (Pd), platinum (Pt), titanium nitride (TiN), tungsten nitride (WN), tungsten (W), ruthenium (Ru), cobalt (Co), conductive metal oxides, and/or other suitable materials.

In some embodiments, the fill metal 194 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Figure 10A:
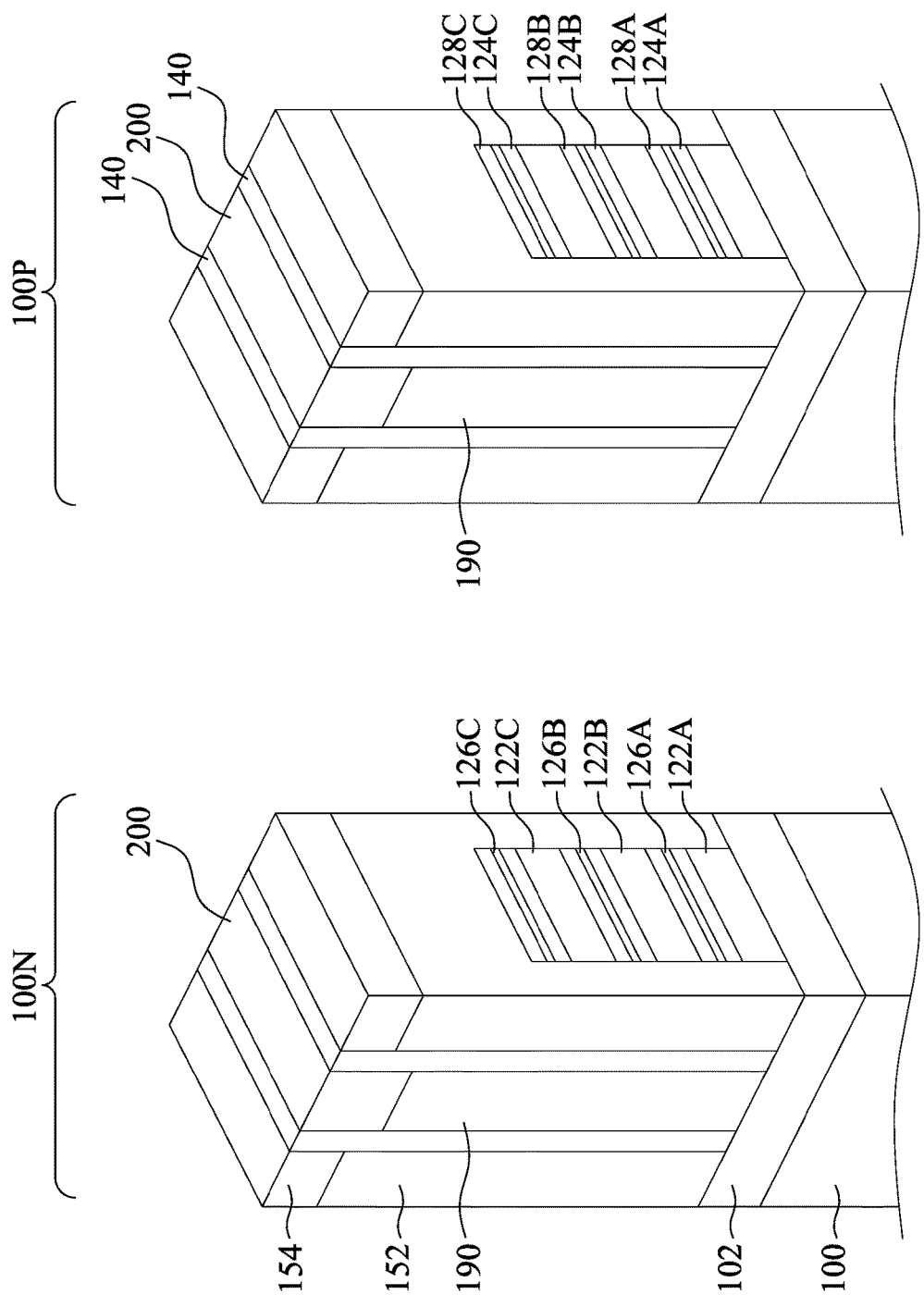
Figure 10B:
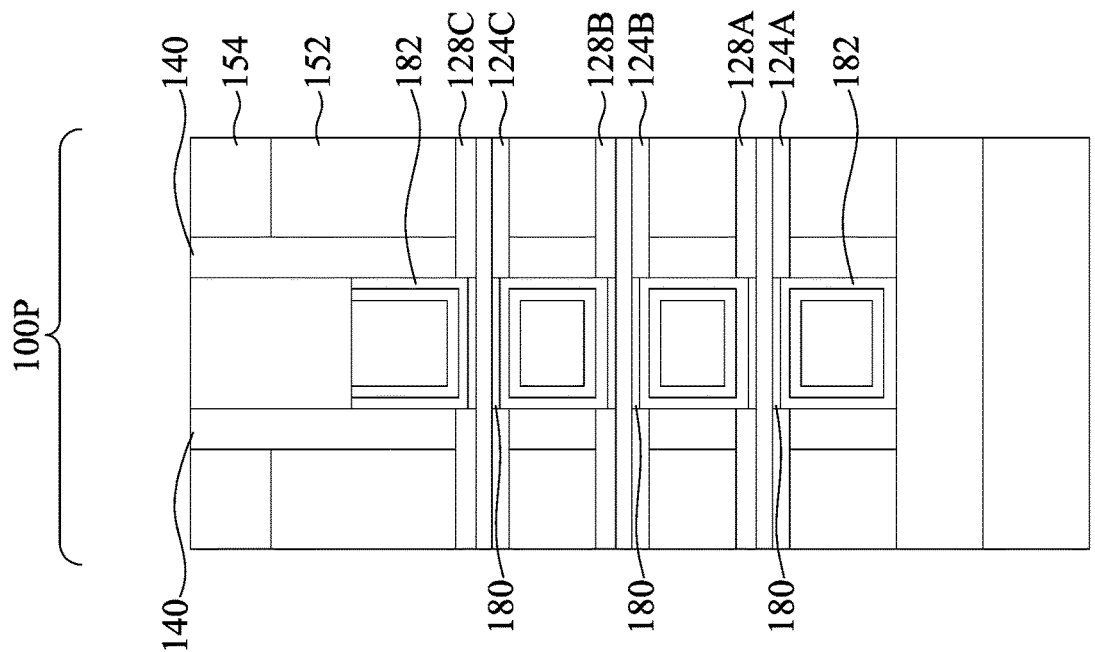
Figure 10B:
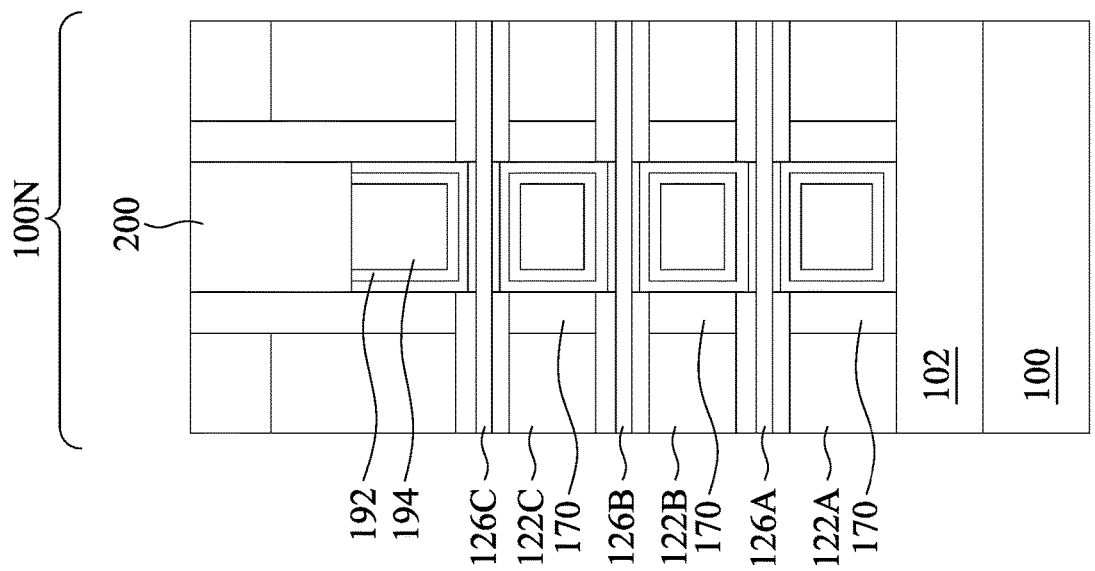
Figure 10C:
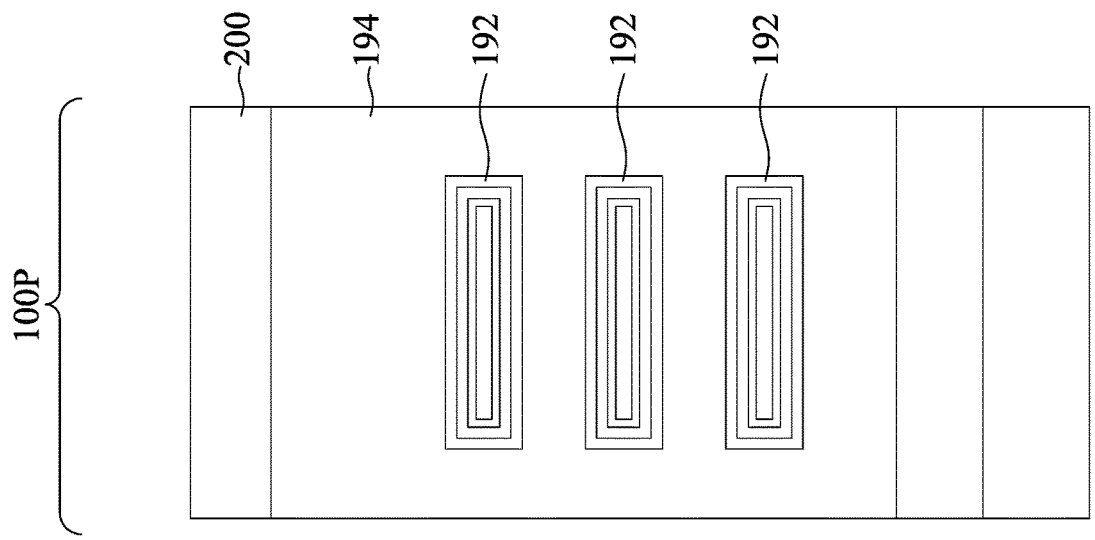
Figure 10C:
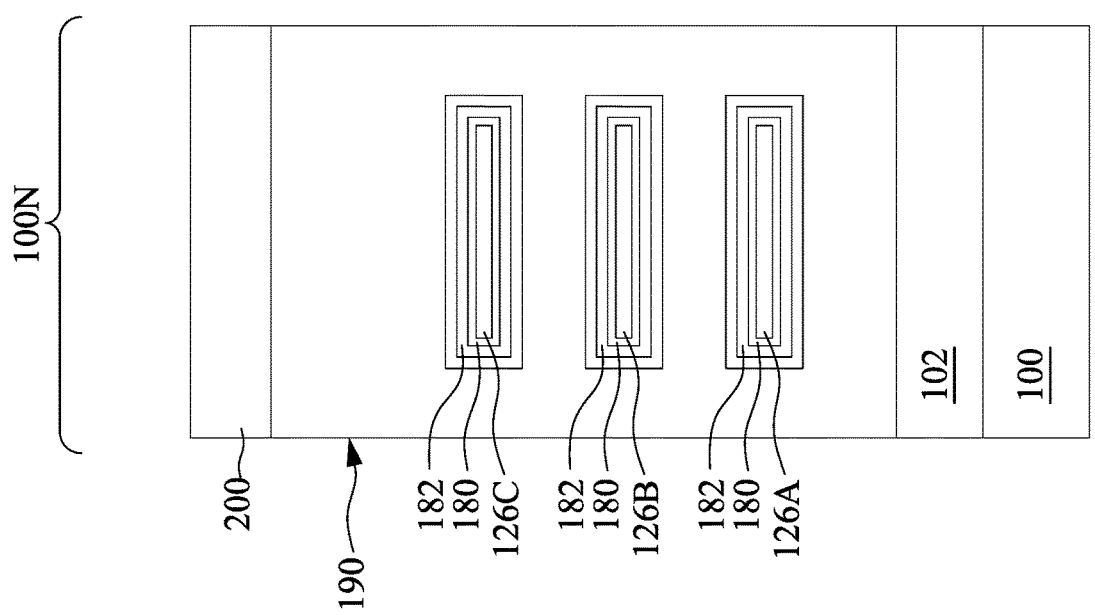

In FIGS. 10A-10C, one or more etching processes are performed to etch back the replacement gate structures 190, resulting in recesses over the etched-back gate structures 190 and between the gate spacers 140. Tis step can be called a metal gate etch back (MGEB) step, if the replacement gate structures 190 are high-k/metal gate (HKMG) structures. The one or more etching processes performed in the MGEB step are selective to materials of HKMG structures 190 compared to gate spacers 140 and the second source/drain cap layer 154, and hence etch rates of the HKMG structures 190 are faster than etch rates of the gate spacers 140 and of the second source/drain cap layer 154. Therefore, the one or more etching processes result in top surfaces of the gate dielectric layer 182, the work function metal layer 192, and the fill metal 194 being lower than top surfaces of gate spacers 140 and of the second source/drain cap layer 154. The one or more etching processes used in the MGEB step includes dry etching, wet etching, atomic layer etching (ALE), plasma etching, other etching back techniques, or combinations thereof. In some embodiments, the one or more etching processes selective to the high-k gate dielectric material, the work function metal, and the fill metal may be, for example, a plasma etching process employing one or more etchants such as a fluorine-containing gas (e.g., $CF_4$, $SF_6$, $CH_2F_2$, $CHF_3$, and/or $C_2F_6$) and/or a chlorine-containing gas (e.g., $Cl_2$, $CHCl_3$, $CCl_4$, and/or $BCl_3$).

Then, in FIGS. 10A-10C, gate hard masks 200 are formed respectively atop the etched-back replacement gate structures 190. In some embodiments, the gate hard masks 200 can be called metal gate hard masks (MGHM), if the replacement gate structures 190 are HKMG structures. The replacement gate hard masks 200 include SiN, SiC, SiCN, SiON, SiCON, a combination thereof or the like. The gate hard masks 200 can be formed by depositing a cap material layer globally over the n-type device region 100N and the p-type device region 100P until the recesses over the etched-back gate structures 190 are overfilled, followed by a CMP process performed to remove excessive cap materials outside the recesses while leaving portions of the cap material layer in the recesses to serve as the gate hard masks 200. In some embodiments, the gate hard masks 200, the gate spacers 140, and the inner spacers 170 are formed of materials having high etch selectivity with respect to the source/drain cap layers 152, 154, the sacrificial semiconductor nanosheets 122, the 2D semiconductor nanosheets 126, and the dielectric nanosheets 124, 128. Therefore, the gate hard masks 200, the gate spacers 140, and the inner spacers 170 can collectively protect the gate structures 190 against an etching step in subsequent source/drain processing.

Figure 11A:
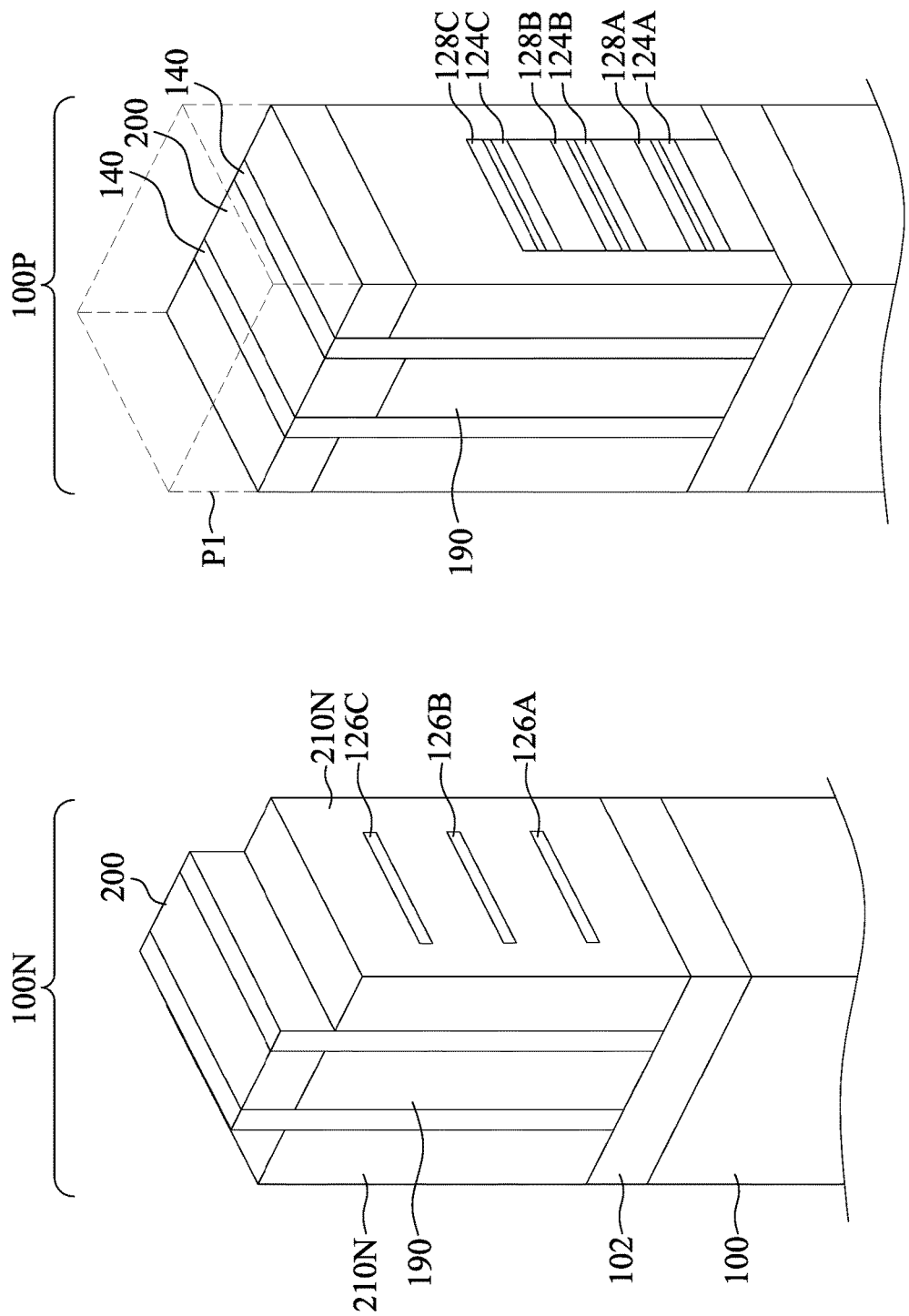
Figure 11B:
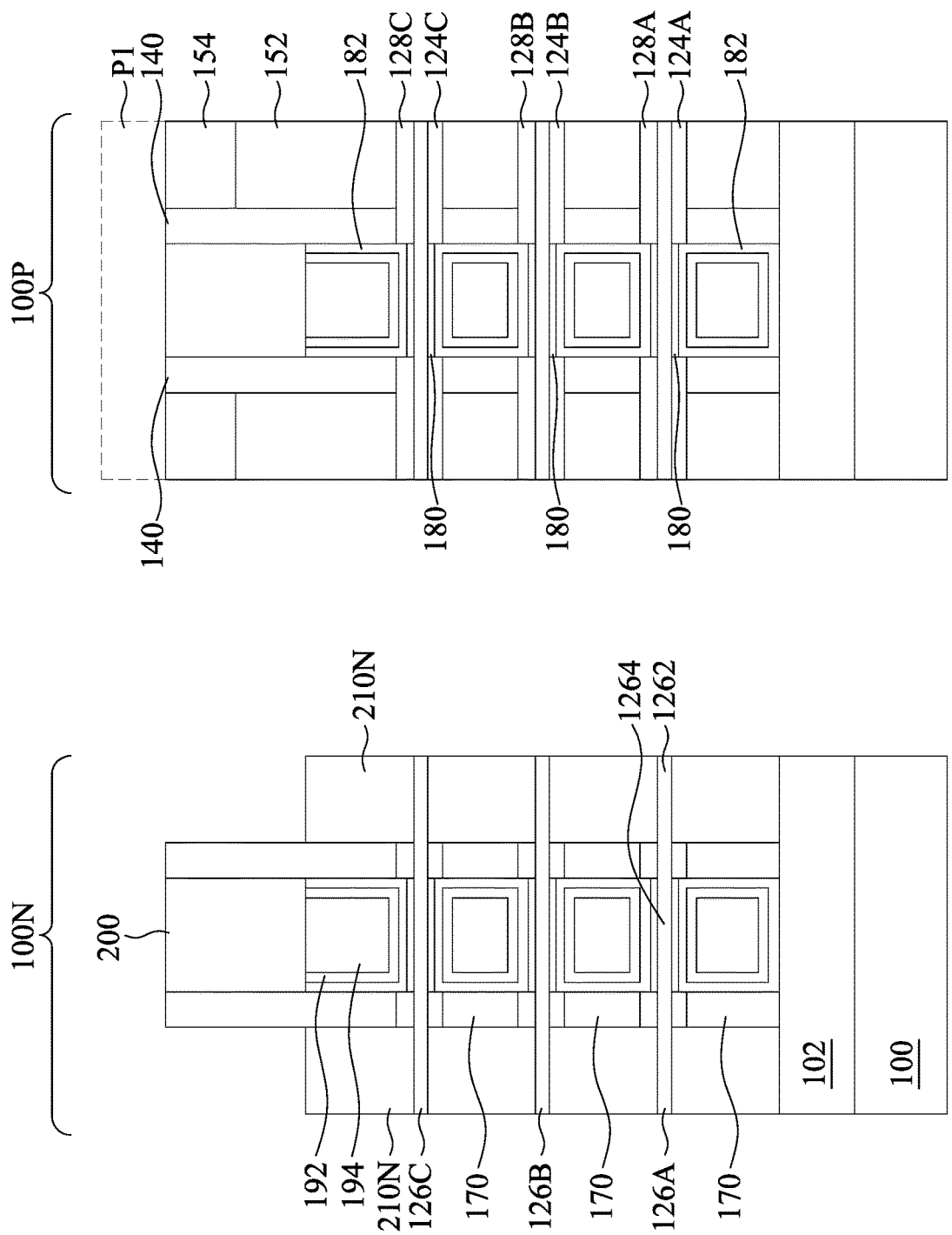

In FIGS. 11A and 11B, after the gate hard masks 200 are formed, a photoresist layer P1 is then formed over both the n-type device region 100N and the p-type device region 100P, and then patterned to expose the n-type device region 100N but not expose the p-type device region 100P. In some embodiments, the photoresist layer P1 is an organic material formed using a spin-on coating process, followed by patterning the organic material to expose the n-type device region 100N using suitable photolithography techniques. For example, photoresist material is irradiated (exposed) and developed to remove portions of the photoresist material. In greater detail, a photomask or reticle (not shown) may be placed above the photoresist material, which may then be exposed to a radiation beam which may be ultraviolet (UV) or an excimer laser such as a Krypton Fluoride (KrF) excimer laser, or an Argon Fluoride (ArF) excimer laser. Exposure of the photoresist material may be performed, for example, using an immersion lithography tool or an extreme ultraviolet light (EUV) tool to increase resolution and decrease the minimum achievable pitch. A bake or cure operation may be performed to harden the exposed photoresist material, and a developer may be used to remove either the exposed or unexposed portions of the photoresist material depending on whether a positive or negative resist is used.

After the patterned photoresist layer P1 is formed, the first and second source/drain cap layers 152 and 154, the dielectric nanosheets 124, 128 and the sacrificial semiconductor nanosheets 122 in the n-type device region 100N are removed by using one or more selective etching processes that etches the source/drain cap layers 152, 154, the dielectric nanosheets 124, 128 and the sacrificial semiconductor nanosheets 122 at a faster etch rat than etching the 2D semiconductor nanosheets 126. As a result, in the n-type device region 100N, source/drain extending regions 1262 of the 2D semiconductor nanosheets 126 extending outside the gate structures 190 get exposed once the source/drain cap layers 152, 154, the dielectric nanosheets 124, 128 and the sacrificial semiconductor nanosheets 122 are removed. In some embodiments, in the n-type device region 100N, the source/drain extending regions 1262 of 2D semiconductor nanosheets 126 remain substantially intact during the one or more etching processes at least because of etch selectivity, and channel regions 1264 of 2D semiconductor nanosheets 126 also remain substantially intact because they are protected at least by the gate structures 190.

After the source/drain cap layers 152, 154, the dielectric nanosheets 124, 128 and the sacrificial semiconductor nanosheets 122 are removed from the n-type device region 100N, an n-type metal source region 210 and an n-type drain region 210N are formed surrounding each of the source/drain extending regions 1262 of the 2D semiconductor nanosheets 126 in the n-type device region 100N. The source region and the drain region are collectively referred to as source/drain regions or S/D regions in some embodiments. The n-type metal source/drain regions 210N include suitable metals for forming Schottky contacts with the 2D semiconductor material of the 2D semiconductor nanosheets 126, which in turn will be advantageous for lowering source/drain resistance. Moreover, the n-type metal source/drain regions 210N are in contact with at least four sides of the source/drain extending regions 1262 of the 2D semiconductor nanosheets 126, thus further reducing the source/drain resistance.

Figure 11C:
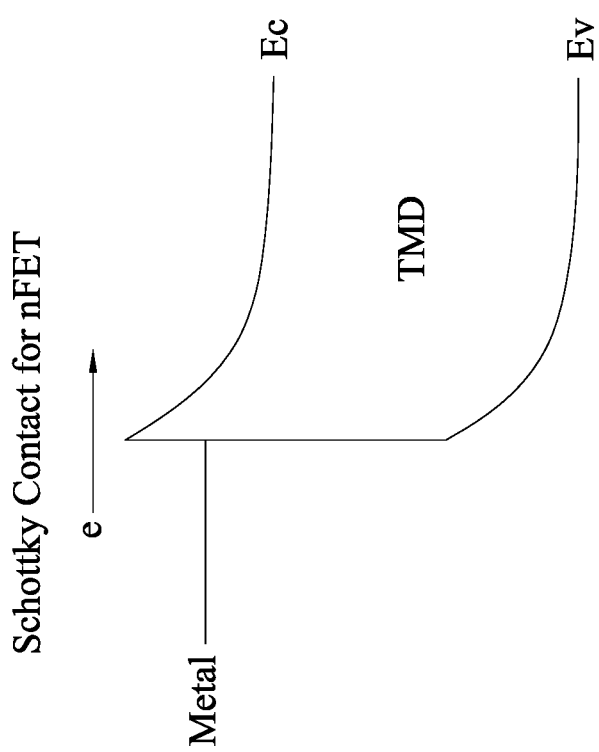
FIG. 11C illustrates an example band diagram of Schottky contact for NFET having TMD nanosheets in accordance with some embodiments of the present disclosure.

In some embodiments, the n-type metal source/drain regions 210N are formed of metal(s) having a band-edge work function close to the conduction band of the 2D semiconductor material (e.g., TMD), as shown in FIG. 11C, which illustrates an example band diagram of Schottky contact for NFET having TMD nanosheets in accordance with some embodiments of the present disclosure. The metal having a band-edge work function close to the conduction band of the 2D semiconductor material allows for electrons (denoted as "e" in FIG. 11C) flowing laterally between the n-type source/drain regions 210N through the 2D semiconductor nanosheets 126, when the gate voltage exceeds a threshold voltage. Therefore, the resulting transistor is of an n-type GAA FET. In some embodiments where the 2D semiconductor material is TMD, the metal having a band-edge work function close to the conduction band of TMD includes, by way of example and not limitation, nickel (Ni), titanium (Ti) or other suitable metals having a work function lower than a mid-gap work function of TMD.

In some embodiments, the entirety of the 2D semiconductor nanosheets 126 (i.e., including the source/drain extension regions 1262 and the channel regions 1264) are un-doped, because the un-doped 2D semiconductor material (e.g., TMD) has both holes and electrons ready for serving as carriers. The dominant carrier type of the GAA FET depends on the metal of the source/drain regions. For example, as discussed previously, when the metal source/drain regions 210N are formed of a metal having a band-edge work function close to the conduction band of the 2D semiconductor material, the dominant carrier type in the un-doped 2D semiconductor nanosheets 126 of the GAA FET will be electrons.

In some embodiments, the n-type metal source/drain regions 210N can be formed by depositing a metal layer having a band-edge work function close to the conduction band of the 2D semiconductor nanosheets 126 using suitable deposition techniques (e.g., CVD, PVD, ALD or the like) to surround each of the 2D semiconductor nanosheets 126, followed by performing a CMP process on the metal layer at least until the gate hard mask 200 and the gate spacers 140 are exposed. In some embodiments, the CMP process uses a slurry that polishes the n-type metal source/drain regions 210N at a faster removal rate than it polishes the gate hard mask 200 and the gate spacers 140. As a result, once the CMP process stops, the n-type source/drain regions 210N may have top surfaces lower than top surfaces of the gate hard mask 200 and the gate spacers 140, as illustrated in FIGS. 11A and 11B. In some embodiments, the photoresist layer P1 is removed after fabrication of the n-type source/drain regions 210N is complete. The photoresist layer P1 can be removed, for example, using a plasma ash process. In some embodiments, a plasma ash process is performed such that the temperature of the photoresist layer P1 is increased until the photoresist P1 experiences a thermal decomposition and may be removed. However, any other suitable process, such as a wet strip, may be utilized.

Figure 12A:
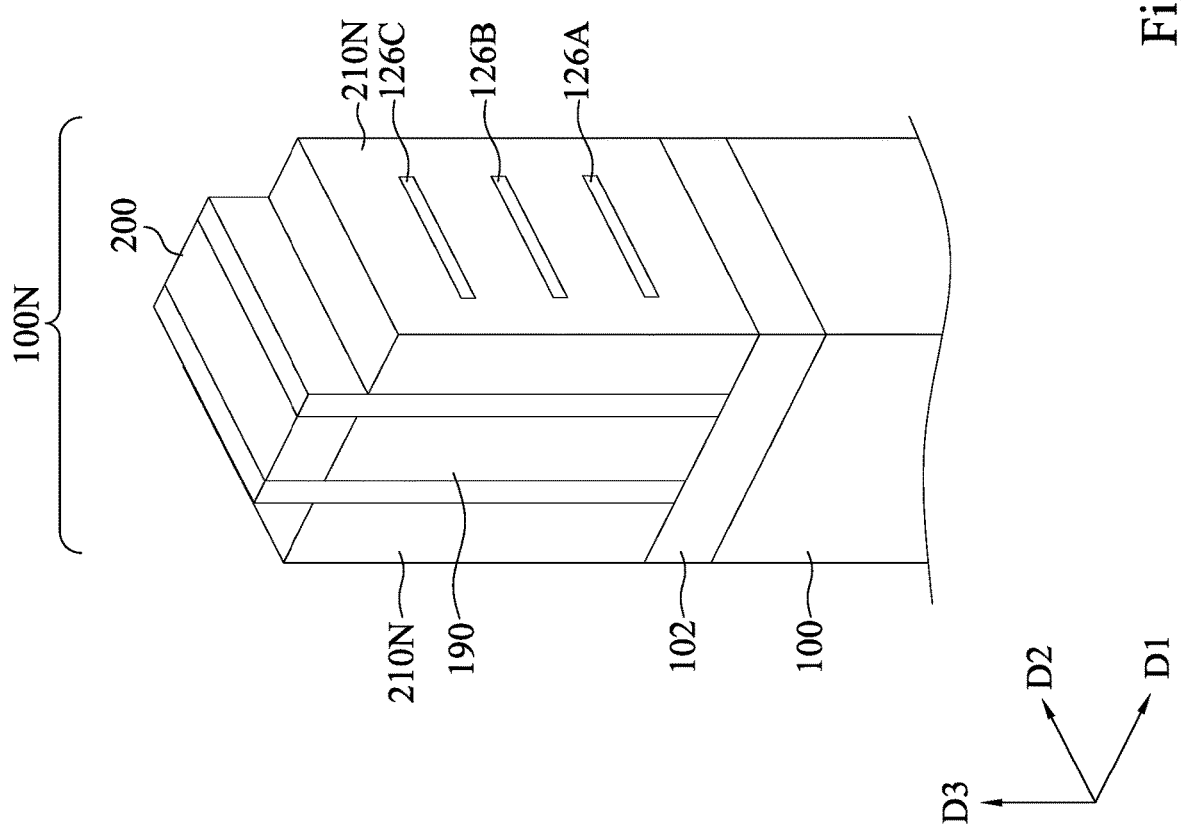
Figure 12B:
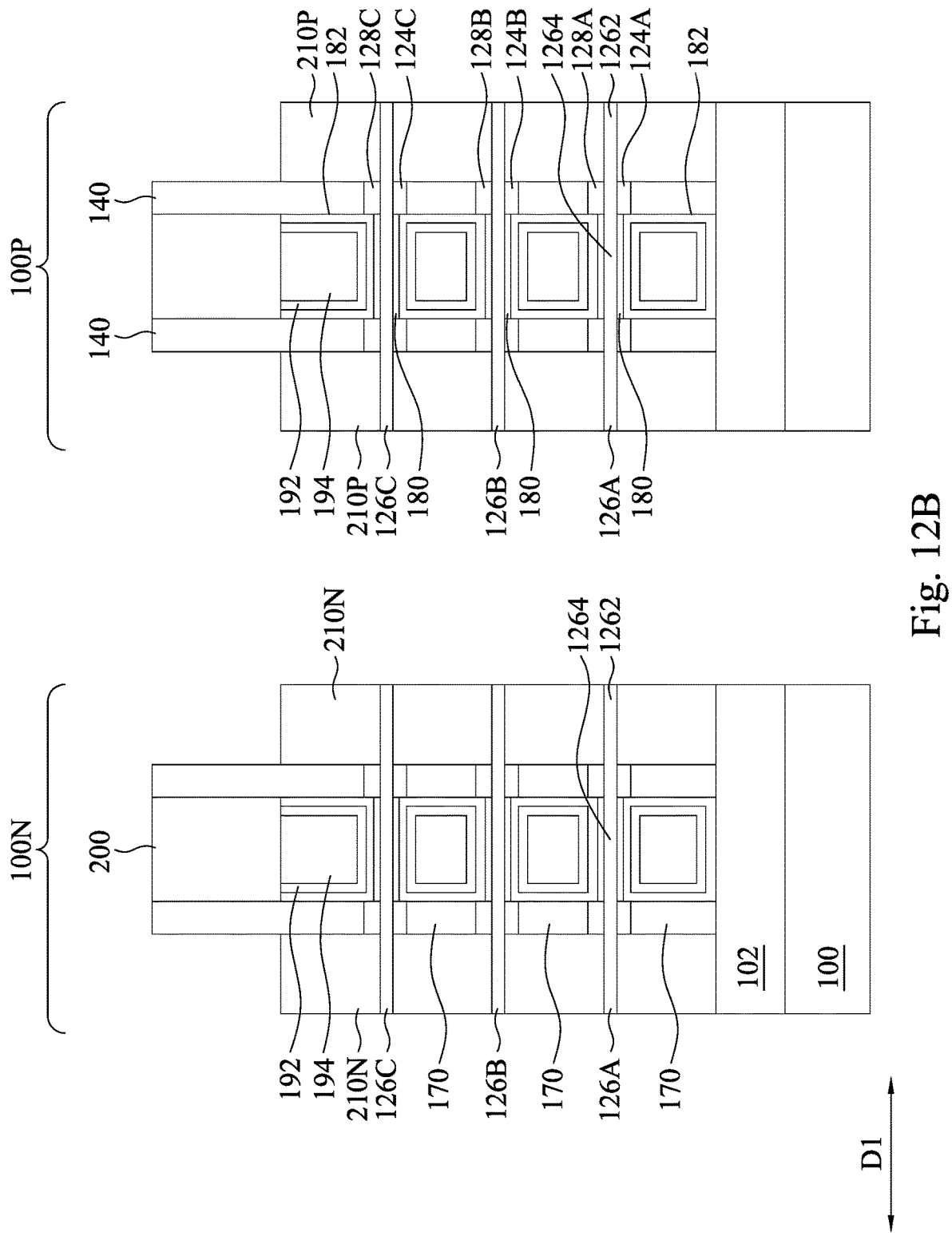

In FIGS. 12A and 12B, after the photoresist layer P1 is removed from the p-type device region 100P, another pattern photoresist layer (not shown) is formed to cover the n-type device region 100N and expose the p-type device region 100P by using suitable photolithography techniques as discussed previously with respect to the photoresist layer P1. Then, the source/drain cap layers 152, 154, the dielectric nanosheets 124, 128, and the sacrificial semiconductor nanosheets 122 in the p-type device region 100P are removed by using one or more selective etching processes, such that source/drain extending regions 1262 of the 2D semiconductor nanosheets 126 in the p-type device region 100P get exposed. In some embodiments, in the p-type device region 100P, the source/drain extending regions 1262 of 2D semiconductor nanosheets 126 remain substantially intact during removing the source/drain cap layers 152, 154, the sacrificial semiconductor nanosheets 122, and the dielectric nanosheets 124, 128 at least because of etch selectivity, and channel regions 1264 of 2D semiconductor nanosheets 126 also remain substantially intact because they are protected at least by the gate structures 190.

After the source/drain cap layers 152, 154, the dielectric nanosheets 124, 128 and the sacrificial semiconductor nanosheets 122 are removed from the p-type device region 100P, p-type metal source/drain regions 210P are formed surrounding each of the source/drain extending regions 1262 of the 2D semiconductor nanosheets 126 in the p-type device region 100P. The p-type metal source/drain regions 210P include suitable metals for forming Schottky contacts with the 2D semiconductor material of the 2D semiconductor nanosheets 126. Moreover, the p-type metal source/drain regions 210P are in contact with at least four sides of the source/drain extending regions 1262 of the 2D semiconductor nanosheets 126, which in turn will be advantageous for lowering source/drain resistance.

Figure 12C:
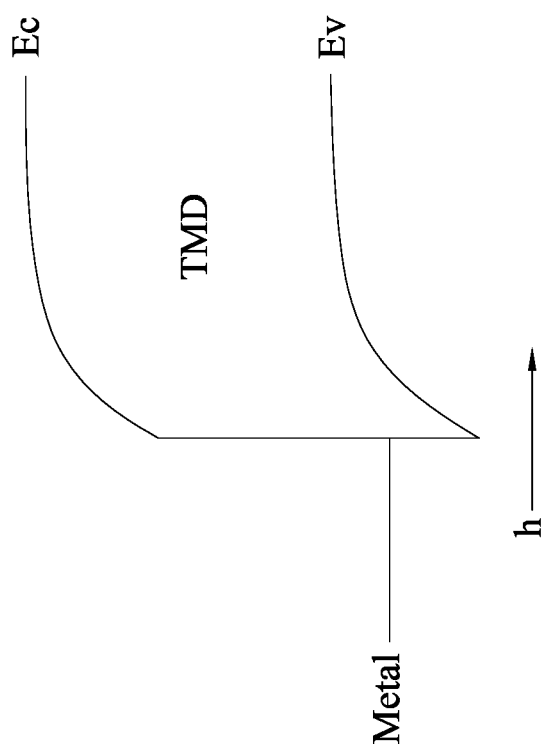
FIG. 12C illustrates an example band diagram of Schottky contact for PFET having TMD nanosheets in accordance with some embodiments of the present disclosure.

In some embodiments, the p-type metal source/drain regions 210P are formed of metal(s) having a band-edge work function close to the valence band of the 2D semiconductor material (e.g., TMD), as shown in FIG. 12C, which illustrates an example band diagram of Schottky contact for PFET having TMD nanosheets in accordance with some embodiments of the present disclosure. The metal having a band-edge work function close to the valence band of the 2D semiconductor material allows for holes (denoted as "h") flowing laterally between the p-type metal source/drain regions 210P through the 2D semiconductor nanosheets 126, when the gate voltage exceeds a threshold voltage. Therefore, the resulting transistor is of a p-type GAA FET. In some embodiments where the 2D semiconductor material is TMD, the metal having a band-edge work function close to the valence band of TMD includes, by way of example and not limitation, palladium (Pd), platinum (Pt), or other suitable metals having a work function higher than a mid-gap work function of TMD.

In some embodiments, the entirety of the 2D semiconductor nanosheets 126 (i.e., including the source/drain extension regions 1262 and the channel regions 1264) in the p-type device region 100P are un-doped, because the un-doped 2D semiconductor material (e.g., TMD) has both holes and electrons ready for serving as carriers. The dominant carrier type of the GAA FET depends on the metal of the source/drain regions. For example, as discussed previously, when the metal source/drain regions 210P are formed of a metal having a band-edge work function close to the valance band of the 2D semiconductor material, the dominant carrier type in the un-doped 2D semiconductor nanosheets 126 of the GAA FET will be holes.

In some embodiments, the p-type metal source/drain regions 210P can be formed by depositing a metal layer having a band-edge work function close to the valence band of the 2D semiconductor nanosheets 126 using suitable deposition techniques (e.g., CVD, PVD, ALD or the like) to surround each of the 2D semiconductor nanosheets 126 in the p-type device region 100P, followed by performing a CMP process on the metal layer at least until the gate hard mask 200 and the gate spacers 140 are exposed. In some embodiments, the CMP process uses a slurry that polishes the p-type metal source/drain regions 210P at a faster removal rate than it polishes the gate hard mask 200 and the gate spacers 140. As a result, once the CMP process stops, the p-type metal source/drain regions 210P may have top surfaces lower than top surfaces of the gate hard mask 200 and the gate spacers 140, as illustrated in FIGS. 12A and 12B. In some embodiments, the photoresist layer covering the n-type device region 100N is removed after fabrication of the p-type metal source/drain regions 210P is complete.

In some embodiments, because the n-type metal source/drain regions 210N are formed of a metal having a band-edge work function close to the conduction band of the 2D semiconductor nanosheets 126, and the p-type metal source/drain regions 210P are formed of a metal having a band-edge work function close to the valence band of the 2D semiconductor nanosheets 126, the metal of the n-type metal source/drain regions 210N has a work function lower than that of the p-type metal source/drain regions 210P. In some embodiments where the 2D semiconductor nanosheets 126 are formed of TMD which has a band gap greater than about 1 eV, 2 eV or higher, the work function difference between the metal of n-type source/drain regions 210N and the metal of p-type source/drain regions 210P may be about 1 eV or higher.

In some embodiments as illustrated in FIGS. 11A-12C, the n-type metal source/drain regions 210N is formed before forming the p-type metal source/drain regions 210P. However, an opposite order about source/drain formation may be feasible as well. For example, in some other embodiments, the p-type metal source/drain regions 210P are formed before forming the n-type metal source/drain regions 210N.

In the resultant GAA FETs as illustrated in FIGS. 12A-12B, each 2D semiconductor nanosheet 126 has a channel length (i.e., length of channel regions 1264) measured in a first horizontal direction D1 (illustrated in) in a range from about 5 nm to about 50 nm (e.g., about 14 nm), according to some embodiments of the present disclosure. In some embodiments, each inner spacer 170 has a thickness measured in the first horizontal direction D1 in a range from about 0.5 nm to about 20 nm (e.g., about 5 nm). In some embodiments, each of the n-type source/drain regions 210N and the p-type source/drain regions 210P has a width measured in the first horizontal direction D1 in a range from about 10 nm to about 20 nm (e.g., about 12 nm). In some embodiments, each interfacial layer 180 has a thickness in a range from about 0.1 nm to about 1 nm (e.g., 0.5 nm). In some embodiments, each gate dielectric layer 182 has a thickness in a range from about 1 nm to about 10 nm. In some embodiments, each gate dielectric layer includes a first high-k dielectric layer with a thickness in a range from about 1 nm to about 3 nm (e.g., about 2 nm) and a second high-k dielectric layer (also called high-k cap layer) with a thickness in a range from about 2 nm to about 4 nm (e.g., about 3 nm). In some embodiments, each 2D semiconductor nanosheet has a channel width (i.e., width of channel regions 1264) measured in a second horizontal direction D2 in a range from about 20 nm to about 30 nm (e.g., about 26 nm), and a channel height measured in a vertical direction D3 in a range from about 0.5 nm to about 10 nm (e.g., about 2 nm), wherein the channel height depends on a total count of mono-layers of the 2D semiconductor material. In some embodiments, a vertical spacing between neighboring two of the 2D semiconductor nanosheets 126 is in a range from about 10 nm to about 20 nm (e.g., about 14 nm). In some embodiments, the etch stop layer 102 has a thickness in a range from about 10 nm to about 100 nm.

Figure 13:
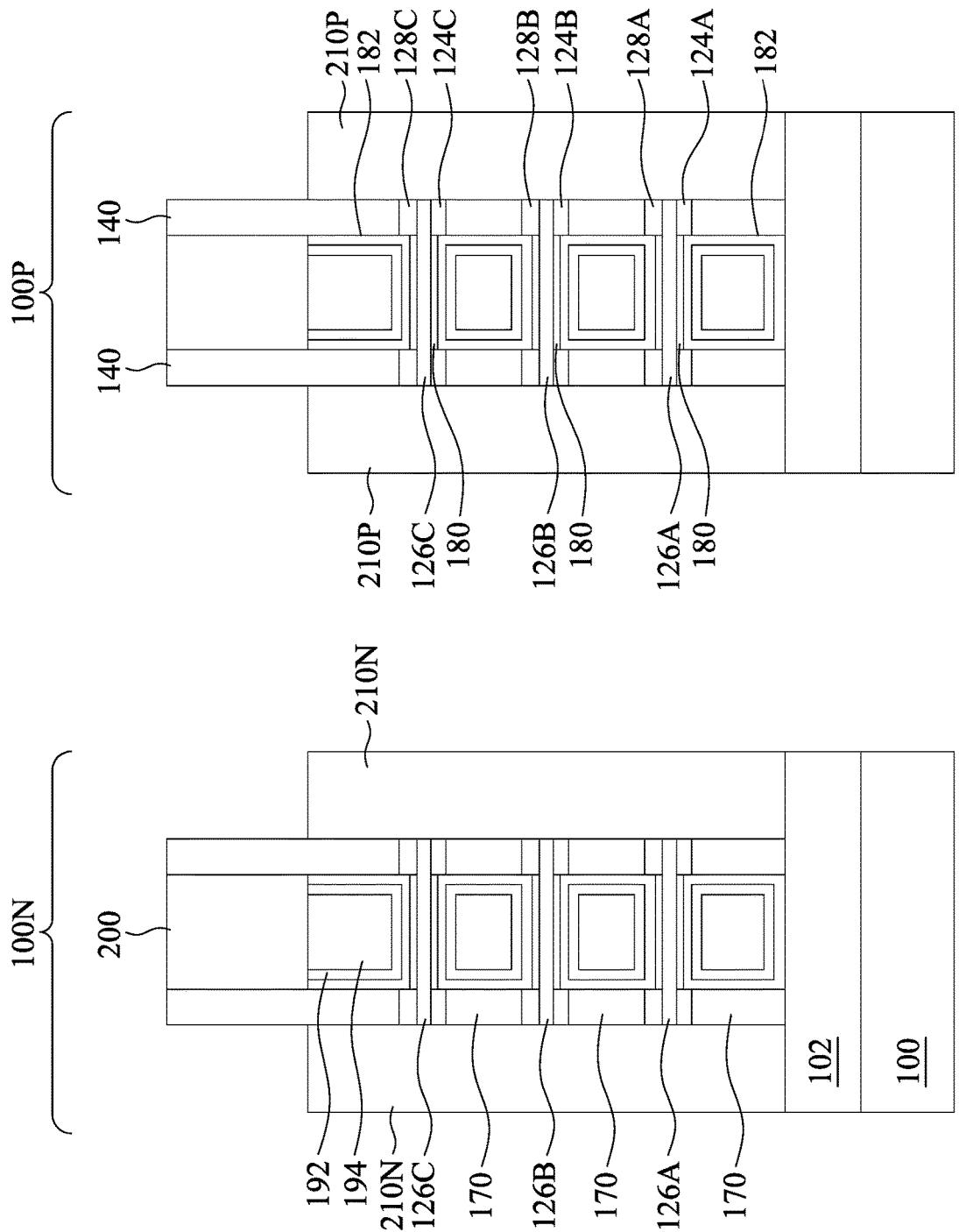
FIG. 13 is a cross-sectional view of GAA devices in accordance with some embodiments of the present disclosure.

FIG. 13 is a cross-sectional view of GAA devices in accordance with some embodiments of the present disclosure. The GAA devices are similar to those illustrated in FIGS. 12A-12B, except that the 2D semiconductor nanosheets 126 terminate prior to reaching beyond the inner spacers 170. In some embodiments, for the n-type GAA device, the source/drain extension regions 1262 of the 2D semiconductor nanosheets 126 (as illustrated in FIGS. 12A-12B) in the n-type device region 100N can be removed by etching before forming the n-type metal source/drain regions 210N. This etching can be controlled such that the resultant 2D semiconductor nanosheets 126 have end surfaces substantially aligned with outer surfaces of remaining portions of the dielectric nanosheets 124, 128, outer surfaces of the inner spacers 170, and outer surfaces of the gate spacers 140. Once the n-type metal source/drain regions 210N are formed, the n-type metal source/drain regions 210N form Schottky contacts with the end surfaces of the 2D semiconductor nanosheets 126. Similarly, for the p-type GAA device, the source/drain extension regions 1262 of the 2D semiconductor nanosheets 126 in the p-type device region 100P can be removed by etching before forming the p-type metal source/drain regions 210P. This etching can be controlled such that the resultant 2D semiconductor nanosheets 126 in the p-type device region 100P have end surfaces substantially aligned with outer surfaces of remaining portions of the dielectric nanosheets 124, 128, outer surfaces of the inner spacers 170, and outer surfaces of the gate spacers 140. Once the p-type metal source/drain regions 210P are formed, the p-type metal source/drain regions 210P form Schottky contacts with the end surfaces of the 2D semiconductor nanosheets 126.

Figure 14:
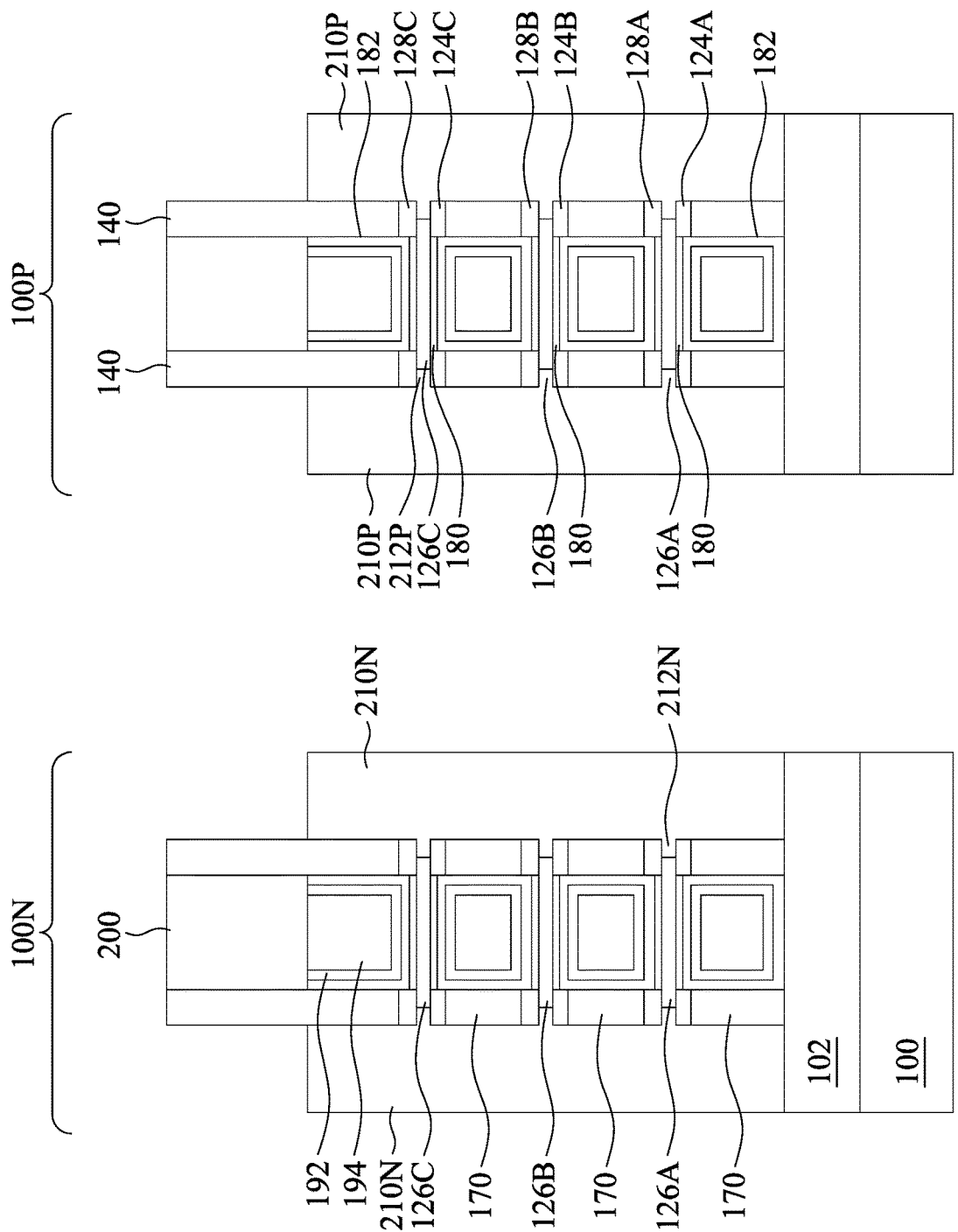
FIG. 14 is a cross-sectional view of GAA devices in accordance with some embodiments of the present disclosure.

FIG. 14 is a cross-sectional view of GAA devices in accordance with some embodiments of the present disclosure. The GAA devices are similar to those illustrated in FIGS. 12A-12B, except that end surfaces of the 2D semiconductor nanosheets 126 are laterally recessed. In some embodiments, for the n-type GAA device, the source/drain extension regions 1262 of the 2D semiconductor nanosheets 126 (as illustrated in FIGS. 12A-12B) in the n-type device region 100N can be removed by etching before forming the n-type metal source/drain regions 210N. This etching can be controlled to further laterally recess the 2D semiconductor nanosheets 126, such that the resultant 2D semiconductor nanosheets 126 have end surfaces laterally set back from outer surfaces of remaining portions of the dielectric nanosheets 124, 128, outer surfaces of the inner spacers 170, and outer surfaces of the gate spacers 140. Once the n-type metal source/drain regions 210N are formed, the n-type metal source/drain regions 210N have protruding portions 212N laterally extending to between remaining portions of the dielectric nanosheets 124, 128 and form Schottky contacts with the recessed end surfaces of the 2D semiconductor nanosheets 126. Similarly, for the p-type GAA device, the source/drain extension regions 1262 of the 2D semiconductor nanosheets 126 in the p-type device region 100P can be removed by etching before forming the p-type metal source/drain regions 210P. This etching can be controlled to further laterally recess the 2D semiconductor nanosheets 126, such that the resultant 2D semiconductor nanosheets 126 in the p-type device region 100P have end surfaces laterally set back from outer surfaces of remaining portions of the dielectric nanosheets 124, 128, outer surfaces of the inner spacers 170, and outer surfaces of the gate spacers 140. Once the p-type metal source/drain regions 210P are formed, the p-type metal source/drain regions 210P have protruding portions 212P extending laterally to between remaining portions of the dielectric nanosheets 124, 128 and form Schottky contacts with the recessed end surfaces of the 2D semiconductor nanosheets 126.

Based on the above discussions, it can be seen that the present disclosure in various embodiments offers advantages. It is understood, however, that other embodiments may offer additional advantages, and not all advantages are necessarily disclosed herein, and that no particular advantage is required for all embodiments. One advantage is that the 2D semiconductor nanosheet thickness can be scaled down with no or negligible impact on channel mobility than silicon, which in turn achieving satisfactory GAA channel mobility with reduced channel thickness. Another advantage is that the metal source/drain regions are formed of suitable metals for forming Schottky contacts with 2D semiconductor nanosheets, which is advantageous for lowering the source/drain resistance. Another advantage is that inner spacers are formed by oxidizing sacrificial semiconductor layers that are alternately arranged with the 2D semiconductor nanosheets, which in turn simplifies the inner spacer fabrication process.

In some embodiments, a device comprises a plurality of 2D semiconductor nanostructures, a gate structure, a source region, and a drain region. The plurality of 2D semiconductor nanostructures extend in a first direction above a substrate and arranged in a second direction substantially perpendicular to the first direction. The gate structure surrounds each of the plurality of 2D semiconductor nanostructures. The source region and the drain region are respectively on opposite sides of the gate structure. In some embodiments, the plurality of 2D semiconductor nanostructures are formed of a transition metal dichalcogenide (TMD) material. In some embodiments, each of the plurality of 2D semiconductor nanostructures is further surrounded by the source region and the drain region. In some embodiments, the source region is formed of a metal. In some embodiments, the metal of the source region has a band-edge work function close to a conduction band of a 2D semiconductor material of the plurality of 2D semiconductor nanostructures. In some embodiments, the metal of the source region has a band-edge work function close to a valence band of a 2D semiconductor material of the plurality of 2D semiconductor nanostructures. In some embodiments, the device further comprises a first gate spacer spacing the source region apart from the gate structure, and a second gate spacer spacing the drain region apart from the gate structure. In some embodiments, the plurality of 2D semiconductor nanostructures have opposite ends respectively aligned with an outermost sidewall of the first gate spacer and an outermost sidewall of the second gate spacer. In some embodiments, each of the plurality of 2D semiconductor nanostructures has a first end laterally set back from an outermost sidewall of the first gate spacer, and a second end laterally set back from an outermost sidewall of the second gate spacer. In some embodiments, the source region has a plurality of source protruding portions directly below the first gate spacer, and the drain region has a plurality of drain protruding portions directly below the second gate spacer. In some embodiments, the device further comprises a plurality of inner spacers alternately arranged with the plurality of 2D semiconductor nanostructures. The gate structure is separated from the source region and the drain region at least in part by the plurality of inner spacers, and the plurality of inner spacers are formed of silicon oxide. In some embodiments, the gate structure comprises a plurality of interfacial layers respectively surrounding the plurality of 2D semiconductor nanostructures, wherein the plurality of interfacial layers are formed of transition metal oxide. In some embodiments, the device further comprises an etch stop layer spacing the gate structure apart from the substrate.

In some embodiments, an IC structure comprises an n-type field effect transistor (NFET) and a p-type field effect transistor (PFET). The NFET and the PFET are over a substrate. The NFET comprises a plurality of NFET semiconductor nanostructures arranged one above another in a spaced apart manner, an NFET gate structure wrapping around each of the NFET semiconductor nanostructures, and n-type source/drain regions respectively on opposite sides of the NFET gate structure. The PFET comprises a plurality of PFET semiconductor nanostructures arranged one above another in a spaced apart manner, a PFET gate structure wrapping around each of the PFET semiconductor nanostructures, and p-type source/drain regions respectively on opposite sides of the PFET gate structure. The n-type source/drain regions are formed of a metal having a band-edge work function close to a conduction band of a 2D semiconductor material of the plurality of NFET semiconductor nanostructures. In some embodiments, the p-type source/drain regions are formed of a metal having a band-edge work function close to a valence band of a 2D semiconductor material of the plurality of PFET semiconductor nanostructures. In some embodiments, the 2D semiconductor material of the NFET semiconductor nanostructures is a transition metal dichalcogenide (TMD) material. In some embodiments, the plurality of PFET semiconductor nanostructures are formed of a 2D semiconductor material same as the 2D semiconductor material of the plurality of NFET semiconductor nanostructures.

In some embodiments, a method comprises forming a fin over a substrate, the fin comprising alternately stacking sacrificial semiconductor layers and 2D semiconductor layers; forming a dummy gate structure over the fin, and gate spacers on either side of the dummy gate structure; removing the dummy gate structure to form a gate trench over the fin; removing first portions of the sacrificial semiconductor layers in the gate trench, such that the 2D semiconductor layers are suspended in the gate trench; and after removing the first portions of the sacrificial semiconductor layers, forming a gate structure around the 2D semiconductor layers. In some embodiments, the fin further comprises dielectric layers each interposing adjacent two of the sacrificial semiconductor layers and the 2D semiconductor layers, and the dielectric layers remain on top and bottom surfaces of the 2D semiconductor layers after removing the first portions of the sacrificial semiconductor layers. In some embodiments, the method further comprises after removing the first portions of the sacrificial semiconductor layers, oxidizing second portions of the sacrificial semiconductor layers to form inner spacers. In some embodiments, the method further comprises after oxidizing the second portions of the sacrificial semiconductor layers, removing un-oxidized portions of the sacrificial semiconductor layers; and after removing the un-oxidized portions of the sacrificial semiconductor layers, forming metal source/drain regions in regions where the un-oxidized portions of the sacrificial semiconductor layers resided.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a fin over a substrate, the fin comprising alternately stacking sacrificial semiconductor layers and 2D semiconductor layers;
    forming a dummy gate structure over the fin, and gate spacers on either side of the dummy gate structure;
    removing the dummy gate structure to form a gate trench over the fin;
    removing first portions of the sacrificial semiconductor layers in the gate trench, such that the 2D semiconductor layers are suspended in the gate trench; and
    after removing the first portions of the sacrificial semiconductor layers, forming a gate structure around the 2D semiconductor layers.

2. The method of claim 1, wherein the fin further comprises dielectric layers each interposing adjacent two of the sacrificial semiconductor layers and the 2D semiconductor layers, and the dielectric layers remain on top and bottom surfaces of the 2D semiconductor layers after removing the first portions of the sacrificial semiconductor layers.

3. The method of claim 1, further comprising:
    after removing the first portions of the sacrificial semiconductor layers, oxidizing second portions of the sacrificial semiconductor layers to form inner spacers.

4. The method of claim 3, further comprising:
    after oxidizing the second portions of the sacrificial semiconductor layers, removing un-oxidized portions of the sacrificial semiconductor layers; and
    after removing the un-oxidized portions of the sacrificial semiconductor layers, forming metal source/drain regions in regions where the un-oxidized portions of the sacrificial semiconductor layers resided.

5. A method comprising:
    forming a plurality of 2D semiconductor nanostructures extending in a first direction above a substrate, the plurality of 2D semiconductor nanostructures arranged in a second direction substantially perpendicular to the first direction;
    forming a gate structure surrounding each of the plurality of 2D semiconductor nanostructures;
    forming a source region and a drain region respectively on opposite sides of the gate structure; and
    forming a first gate spacer spacing the source region apart from the gate structure, wherein the first gate spacer is separated from a topmost one of the plurality of 2D semiconductor nanostructures.

6. The method of claim 5, wherein the plurality of 2D semiconductor nanostructures are formed of a transition metal dichalcogenide (TMD) material.

7. The method of claim 5, wherein each of the plurality of 2D semiconductor nanostructures is further surrounded by the source region and the drain region.

8. The method of claim 5, wherein the source region or the drain region is formed of a metal.

9. The method of claim 8, wherein the metal of the source region or the drain region has a band-edge work function close to a conduction band of a 2D semiconductor material of the plurality of 2D semiconductor nanostructures.

10. The method of claim 5, further comprising:
    forming a second gate spacer spacing the drain region apart from the gate structure,
    wherein the plurality of 2D semiconductor nanostructures have opposite ends respectively aligned with an outermost sidewall of the first gate spacer and an outermost sidewall of the second gate spacer.

11. The method of claim 5, further comprising:
    forming a second gate spacer spacing the drain region apart from the gate structure,
    wherein each of the plurality of 2D semiconductor nanostructures has a first end laterally set back from an outermost sidewall of the first gate spacer, and a second end laterally set back from an outermost sidewall of the second gate spacer.

12. The method of claim 11, wherein the source region has a plurality of source protruding portions directly below the first gate spacer, and the drain region has a plurality of drain protruding portions directly below the second gate spacer.

13. The method of claim 5, further comprising:
forming a plurality of inner spacers alternately arranged with the plurality of 2D semiconductor nanostructures, the gate structure being separated from the source region and the drain region at least in part by the plurality of inner spacers.

14. The method of claim 5, wherein the gate structure comprises a plurality of interfacial layers respectively surrounding the plurality of 2D semiconductor nanostructures.

15. The method of claim 5, further comprising:
forming an etch stop layer spacing the gate structure apart from the substrate.

16. A method comprising:
forming an n-type field effect transistor (NFET) over a substrate, the NFET comprising a plurality of NFET semiconductor nanostructures arranged one above another in a spaced apart manner, an NFET gate structure wrapping around each of the NFET semiconductor nanostructures, and n-type source/drain regions respectively on opposite sides of the NFET gate structure; and
forming a p-type field effect transistor (PFET) over the substrate, the PFET comprising a plurality of PFET semiconductor nanostructures arranged one above another in a spaced apart manner, a PFET gate structure wrapping around each of the PFET semiconductor nanostructures, and p-type source/drain regions respectively on opposite sides of the PFET gate structure,
wherein the n-type source/drain regions are formed of a metal having a band-edge work function close to a conduction band of a 2D semiconductor material of the plurality of NFET semiconductor nanostructures.

17. The method of claim 16, wherein the p-type source/drain regions are formed of a metal having a band-edge work function close to a valence band of a 2D semiconductor material of the plurality of PFET semiconductor nanostructures.

18. The method of claim 16, wherein the 2D semiconductor material of the NFET semiconductor nanostructures is a transition metal dichalcogenide (TMD) material.

19. The method of claim 16, wherein the plurality of PFET semiconductor nanostructures are formed of a 2D semiconductor material same as the 2D semiconductor material of the plurality of NFET semiconductor nanostructures.

20. The method of claim 5, wherein the source region and the drain region are p-type source/drain regions, wherein the p-type source/drain regions are formed of a metal having a band-edge work function close to a valence band of a 2D semiconductor material of the plurality of 2D semiconductor nanostructures.

* * * * *